United States Patent
Fox et al.

(10) Patent No.: US 9,265,150 B2
(45) Date of Patent: Feb. 16, 2016

(54) SEMI-COMPLIANT TERMINALS

(71) Applicant: LEAR CORPORATION, Southfield, MI (US)

(72) Inventors: George E. Fox, Maybee, MI (US); Bert W. Eakins, Ortonville, MI (US)

(73) Assignee: Lear Corporation, Southfield, MI (US)

( * ) Notice: Subject to any disclaimer, the term of this patent is extended or adjusted under 35 U.S.C. 154(b) by 87 days.

(21) Appl. No.: 14/180,475

(22) Filed: Feb. 14, 2014

(65) Prior Publication Data
US 2015/0235733 A1    Aug. 20, 2015

(51) Int. Cl.
| H01R 12/00 | (2006.01) |
| H05K 1/18 | (2006.01) |
| H01R 12/58 | (2011.01) |
| H05K 3/30 | (2006.01) |
| H01R 12/71 | (2011.01) |
| H01R 13/05 | (2006.01) |

(52) U.S. Cl.
CPC ............... *H05K 1/18* (2013.01); *H01R 12/585* (2013.01); *H05K 3/308* (2013.01); *H01R 12/718* (2013.01); *H01R 13/055* (2013.01); *H05K 2201/10303* (2013.01); *H05K 2201/10856* (2013.01); *H05K 2201/10871* (2013.01)

(58) Field of Classification Search
CPC ...... H01R 9/092; H01R 13/41; H01R 12/585; H01R 12/58
USPC .............................................. 439/82, 84, 751
See application file for complete search history.

(56) References Cited

U.S. PATENT DOCUMENTS

| 4,379,611 | A | 4/1983 | Foege et al. |
| 4,874,338 | A | 10/1989 | Bakermans |
| 5,151,056 | A | 9/1992 | McClune |
| 6,062,916 | A | 5/2000 | Gladd et al. |
| 7,008,272 | B2 * | 3/2006 | Blossfeld ...................... 439/751 |
| 7,240,427 | B2 * | 7/2007 | Ocket ............................. 29/844 |
| 7,957,156 | B2 * | 6/2011 | Palomo ......................... 361/779 |
| 8,002,559 | B2 * | 8/2011 | Thiel et al. ..................... 439/82 |

FOREIGN PATENT DOCUMENTS

| WO | 2006/105484 A1 | 10/2006 |
| WO | 2008/005945 A2 | 1/2008 |
| WO | 2013/055557 A1 | 4/2013 |

* cited by examiner

*Primary Examiner* — Vanessa Girardi
(74) *Attorney, Agent, or Firm* — Dykema Gossett PLLC

(57) ABSTRACT

The present disclosure includes an electrical terminal that may include a first portion, a second portion, and/or a middle portion. A middle portion may be disposed between first and second portions and/or a middle portion may include a first middle section, a second middle section, a recessed portion disposed between the first middle section and the second middle section, and/or an aperture. The electrical terminal may include a transition portion that may be disposed between a middle portion and a second portion.

20 Claims, 11 Drawing Sheets

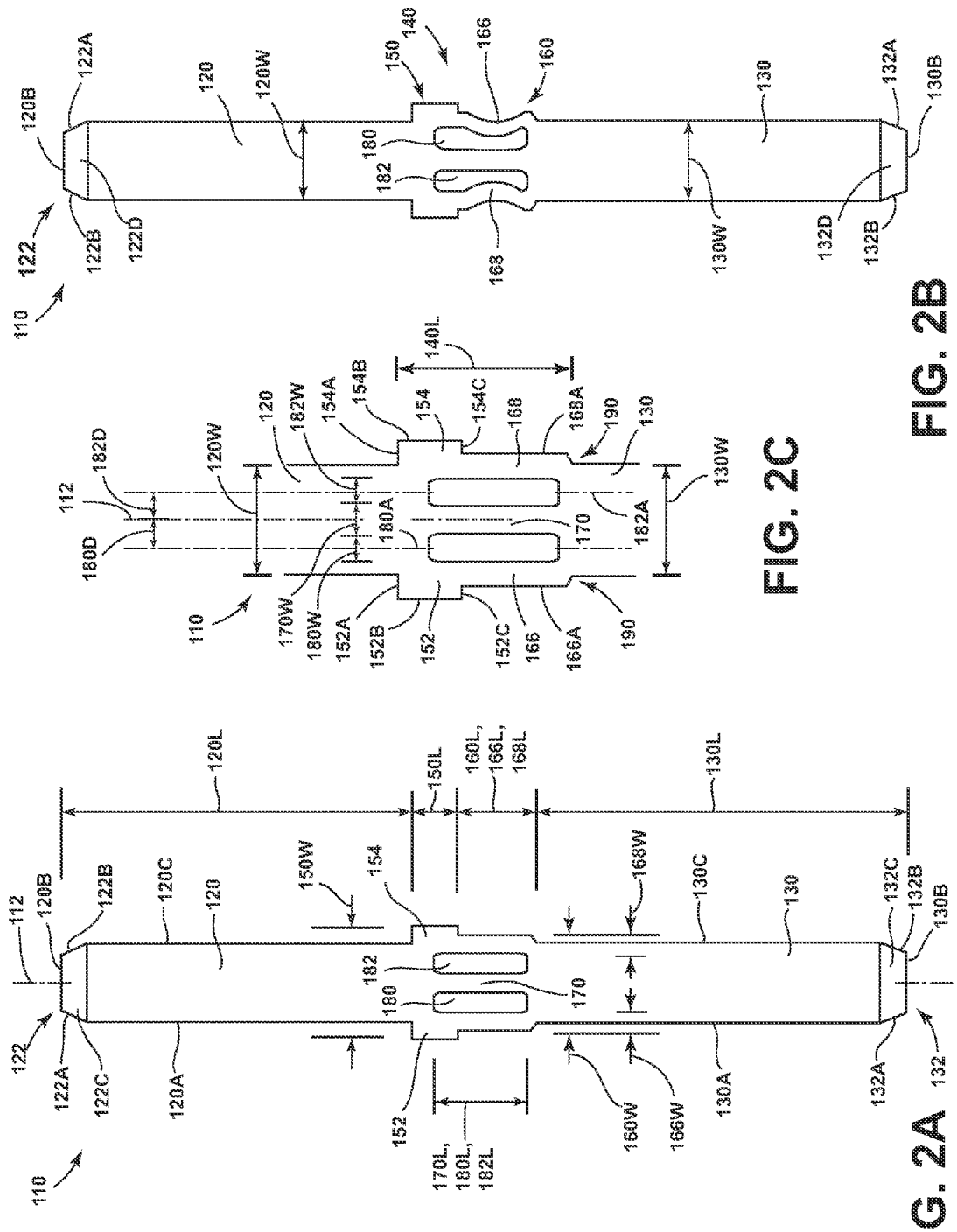

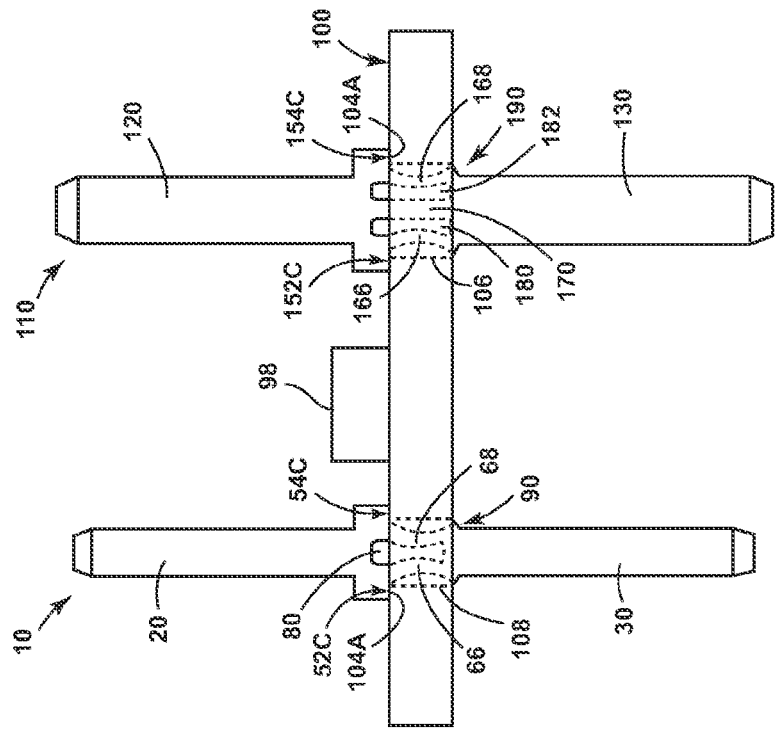
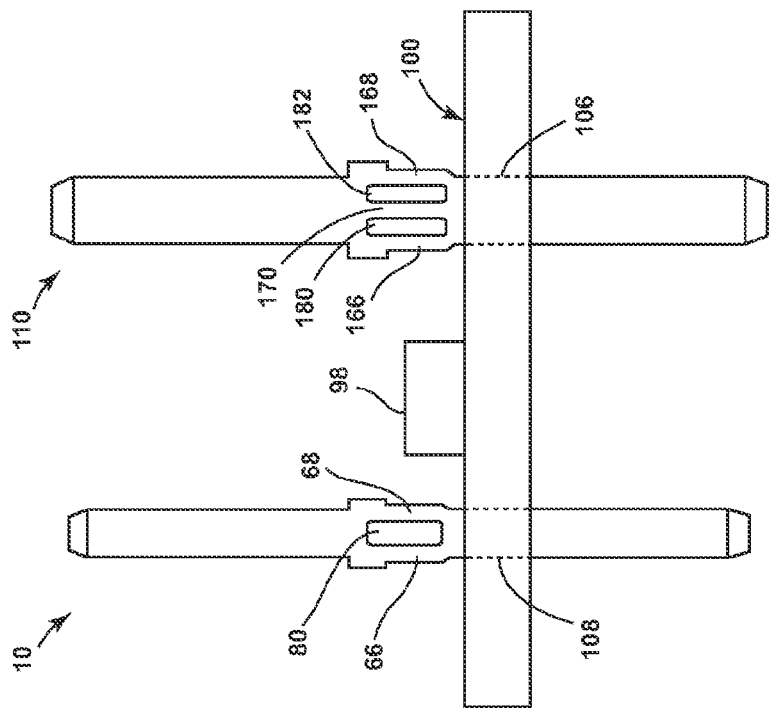

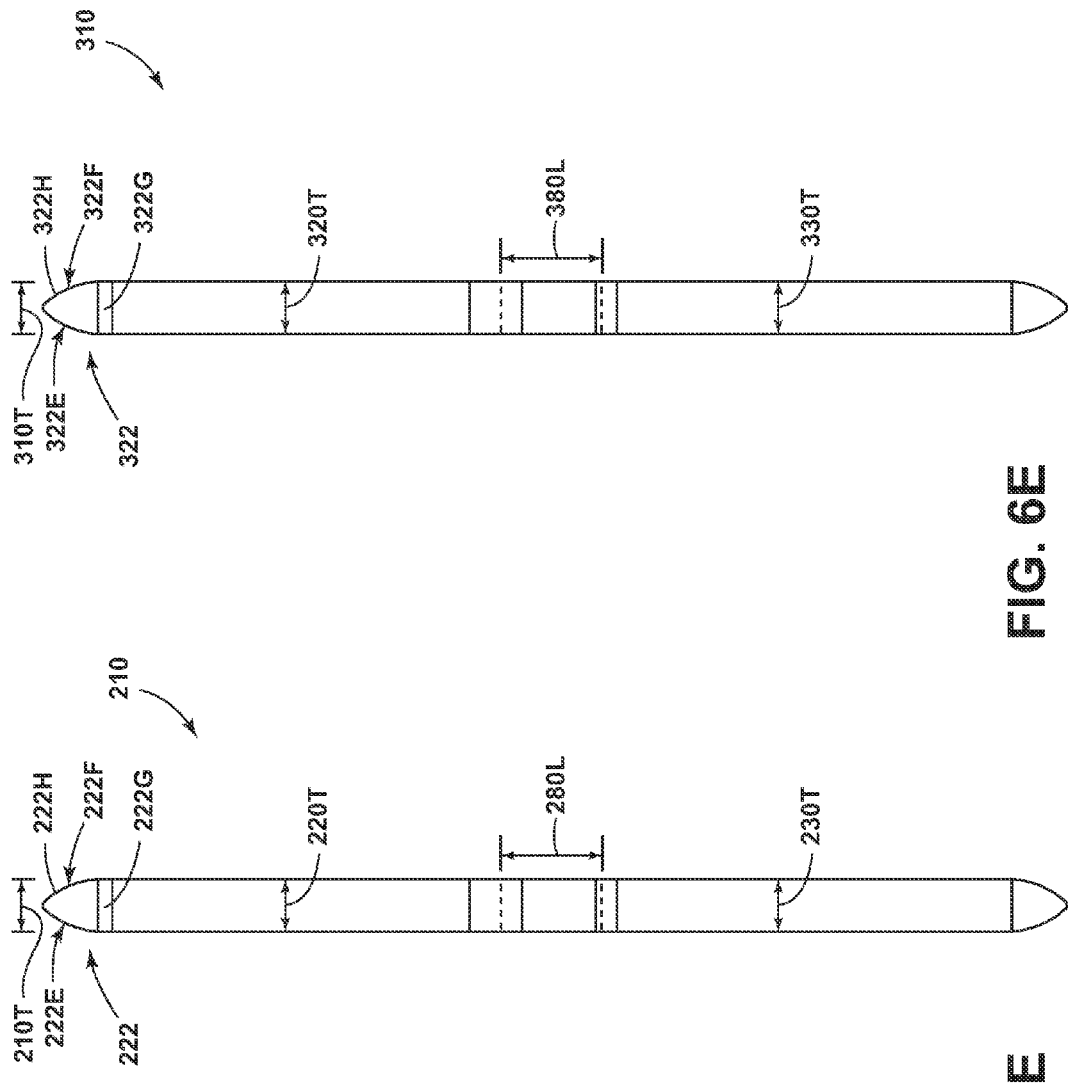

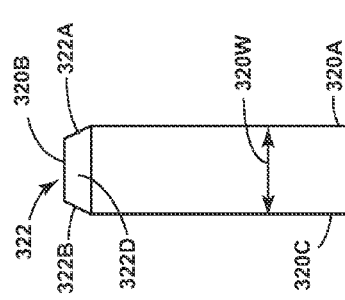
FIG. 6C
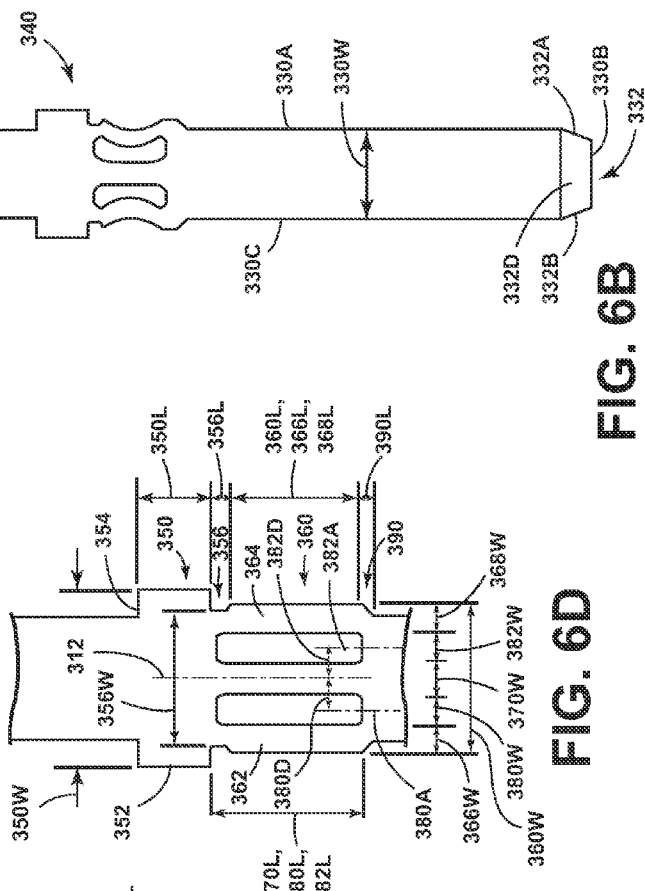
FIG. 6B
FIG. 6D
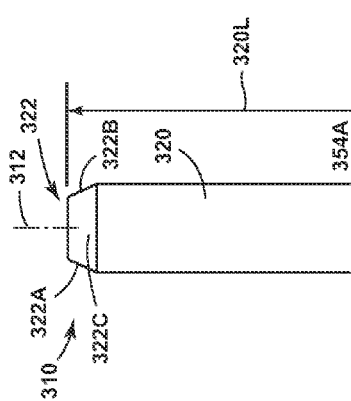
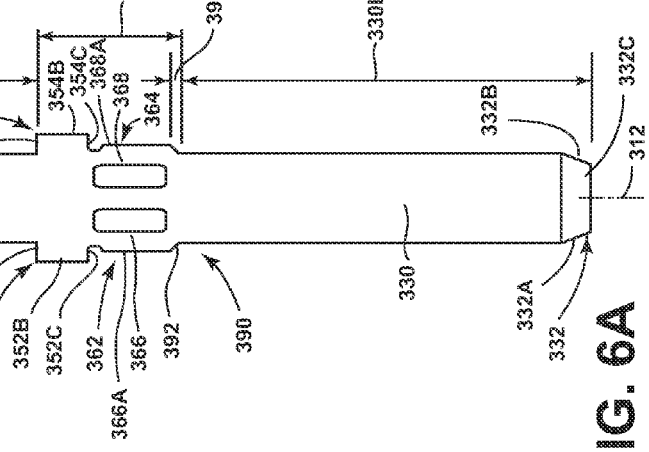
FIG. 6A

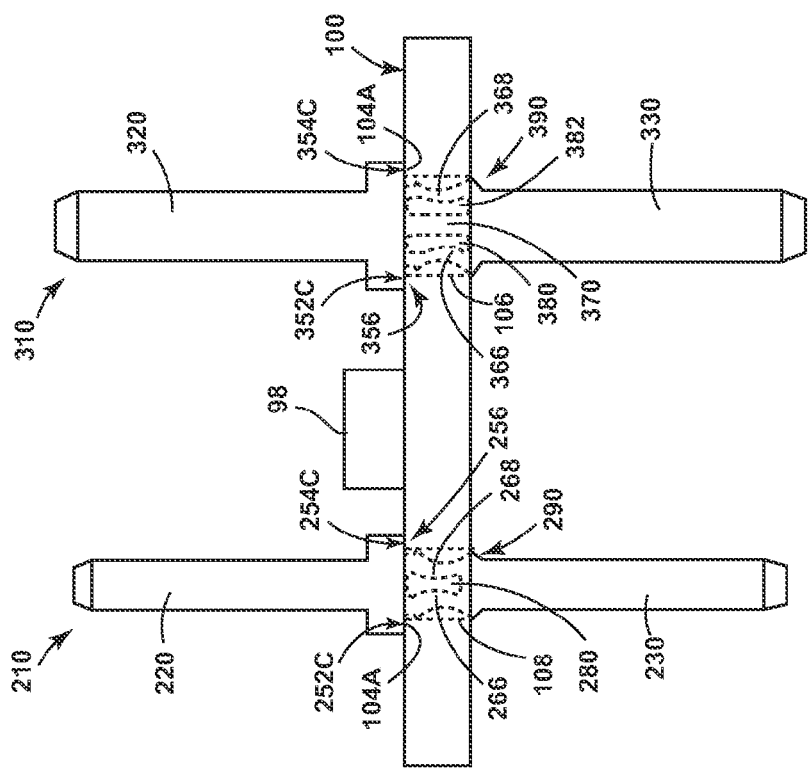
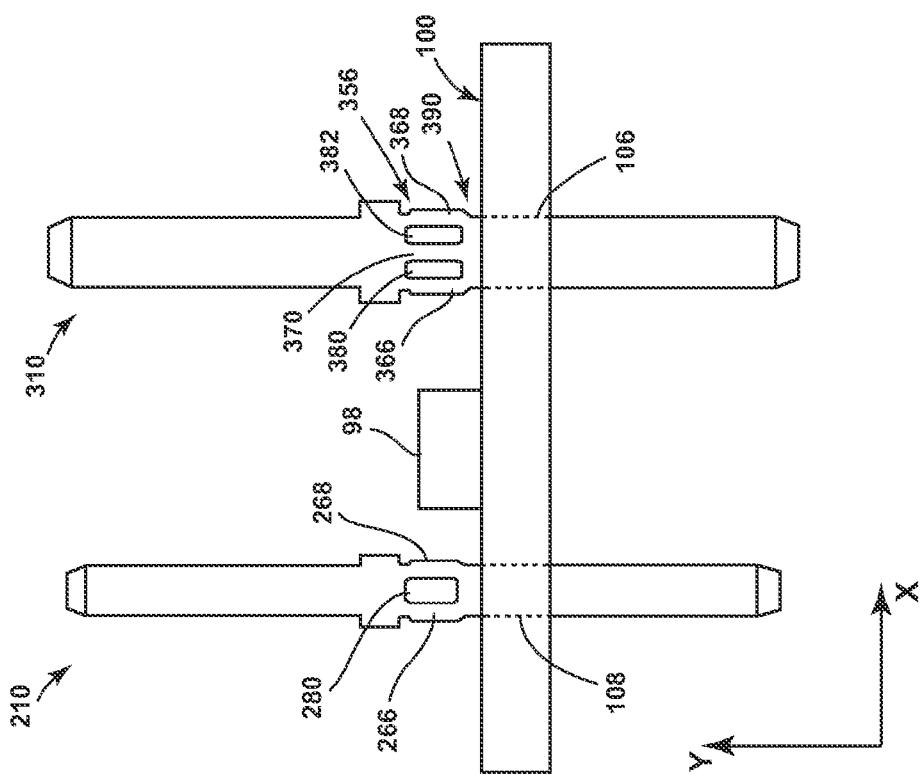

SEMI-COMPLIANT TERMINALS

BACKGROUND

The present disclosure relates to electrical components, including electrical connectors and/or electrical terminals.

SUMMARY

The present disclosure includes an electrical terminal, which may comprise a first portion, a second portion, and/or a middle portion that may be disposed between the first and second portions. In embodiments, a middle portion may comprise a first middle section, a second middle section, a recessed portion that may be disposed between the first middle section and the second middle section, and/or an aperture. In embodiments, an electrical terminal may include a transition portion that may be disposed between the middle portion and the second portion.

In embodiments, an electrical terminal may include an aperture that is disposed entirely in a middle portion and/or an aperture disposed entirely in a second middle section and a recessed portion. In embodiments, an electrical terminal may be configured to prevent a solder mask from passing through an aperture. In embodiments, an electrical terminal may include a first middle section that may include a width, a second middle section that may include a width, and/or a recessed portion that may include a width that may be less wide than widths of the first and second middle sections. In embodiments, a length of a recessed portion may be configured to reduce a press length of an electrical terminal. In embodiments, an electrical terminal may include a second middle section that may be semi-compliant. In embodiments, an electrical terminal may include a middle portion that may include first and/or second side walls, which may be configured to deflect inward. In embodiments, an electrical terminal may include a middle portion that may include a first and/or a second aperture. In embodiments, an electrical terminal may include a first middle portion that may include first and/or second semi-compliant side walls and/or a resilient middle wall.

The present disclosure also includes a semi-compliant electrical terminal, which may comprise a first connector portion, a second connector portion, and/or a semi-compliant middle portion. In embodiments, a semi-compliant middle portion may comprise a first middle section and/or a second middle section that may include a first side wall, a second side wall, and/or an inner wall. In embodiments, a semi-compliant terminal may include a first aperture and/or a second aperture, wherein a first side wall and/or a second side wall may be configured to deflect, and/or an inner wall may be disposed between a first aperture and a second aperture.

In embodiments, a semi-compliant electrical terminal may include an inner wall that may be configured to resist deflection. In embodiments, a semi-compliant electrical terminal may comprise a recessed portion between a first middle section and a second middle section. In embodiments, a semi-compliant electrical terminal may include a recessed portion that may include a length that may correspond to a reduced press length. In embodiments, a semi-compliant electrical terminal may include a recessed portion having a width that may be less wide than a width of a first middle section and/or less wide than a width of a second middle section.

In embodiments, a semi-compliant electrical terminal may include a second middle section that may include a width that may be substantially constant and/or a width of a second middle section may be less wide than a width of a first middle section. In embodiments, a semi-compliant electrical terminal may include a recessed portion that may include a length and/or a width that may be configured to provide space for plowed copper to seat and/or to allow the terminal to be flush to a circuit board. In embodiments, a semi-compliant electrical terminal may be configured for use with at least about 23 amps. In embodiments, a semi-compliant electrical terminal may include outer walls of a semi-compliant middle portion that may be configured to rub against a plated elongated hole of a circuit board without contacting a substrate of the circuit board.

The present disclosure also includes a circuit board, which may comprise a substrate that may include metal plating and/or first and second semi-compliant terminals, the first and second semi-compliant terminals comprising a first portion, a second portion, and/or a semi-compliant middle portion. In embodiments, a semi-compliant terminal may include a semi-compliant middle portion that may comprise a first tabbed portion and/or second tabbed portion, which may include a first side wall and a second side wall, and/or an aperture. In embodiments, a semi-compliant terminal may include a first side wall and/or a second side wall of first and second semi-compliant terminals may be configured to deflect. In embodiments, a second semi-compliant terminal may include first and/or second apertures and/or a resilient inner wall that may be disposed between the two apertures. In embodiments, a second semi-compliant terminal may include first and/or second portions that may include widths that may be wider than widths of first and second portions of a first semi-compliant terminal.

BRIEF DESCRIPTION OF THE DRAWINGS

FIGS. 2A and 2B are side views of embodiments of semi-compliant terminals in accordance with teachings of the present disclosure.

FIG. 2C is a side view of a portion of an embodiment of a semi-compliant terminal in accordance with teachings of the present disclosure.

FIGS. 4A and 4B are side views of embodiments of semi-compliant terminals and circuit boards in accordance with teachings of the present disclosure.

FIG. 5E is a side view of an embodiment of a semi-compliant terminal in accordance with teachings of the present disclosure.

FIGS. 6A and 6B are side views of embodiments of semi-compliant terminals and circuit boards of in accordance with teachings of the present disclosure.

FIGS. 6C and 6D are side views of portions of embodiments of a semi-compliant terminal in accordance with teachings of the present disclosure.

FIG. 6E is a side view of an embodiment of a semi-compliant terminal in accordance with teachings of the present disclosure.

FIGS. 7A and 7B are side views of embodiments of semi-compliant terminals and circuit boards of in accordance with teachings of the present disclosure.

DETAILED DESCRIPTION

Reference will now be made in detail to embodiments of the present disclosure, examples of which are described herein and illustrated in the accompanying drawings. While the invention will be described in conjunction with embodiments and/or examples, it will be understood that they are not intended to limit the invention to these embodiments and/or examples. On the contrary, the invention is intended to cover alternatives, modifications and equivalents, which may be included within the spirit and scope of the invention as defined by the appended claims.

Figures 1A, 1B:
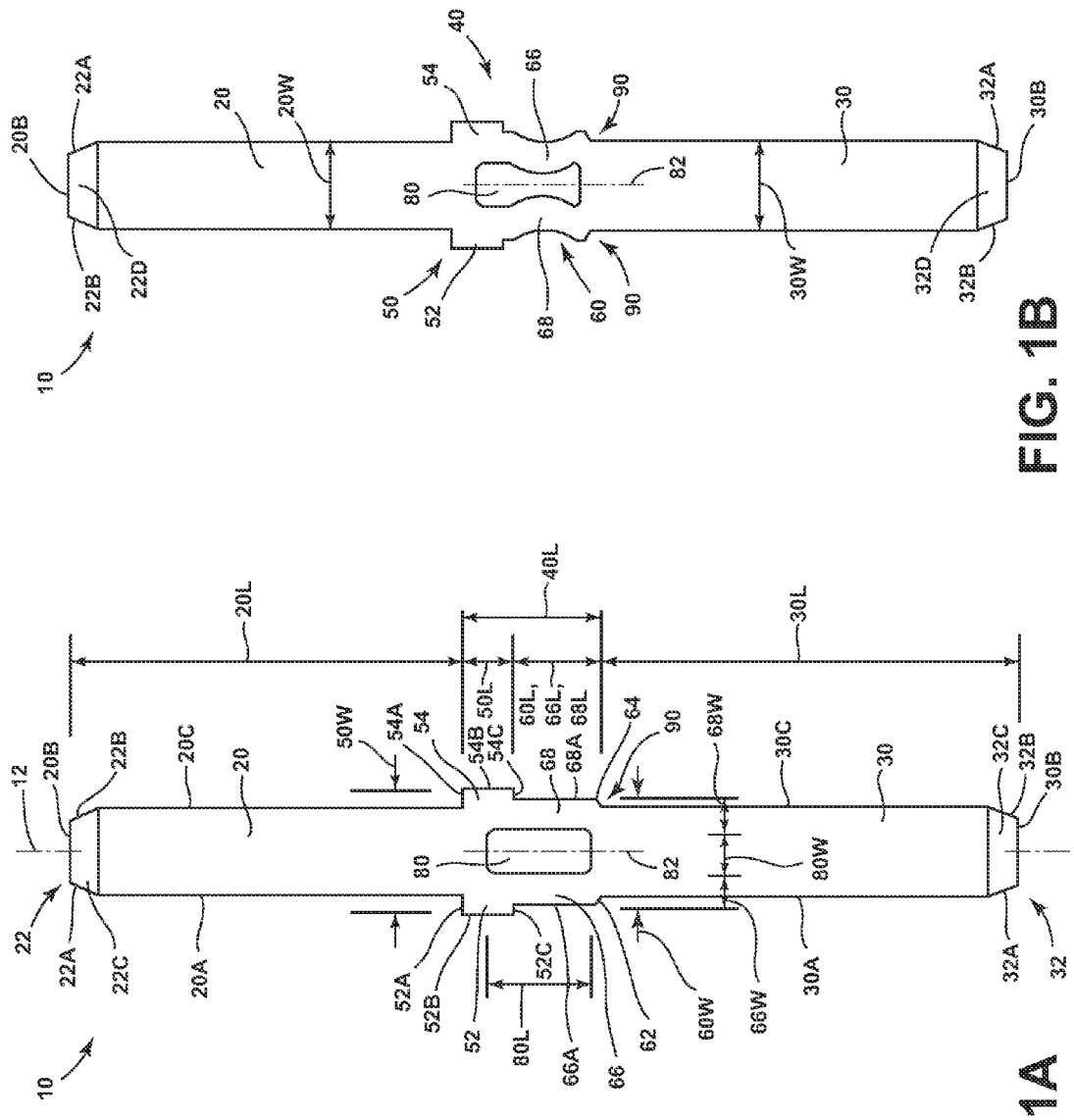
FIGS. 1A and 1B are side views of embodiments of semi-compliant terminals in accordance with teachings of the present disclosure.
Figure 1C:
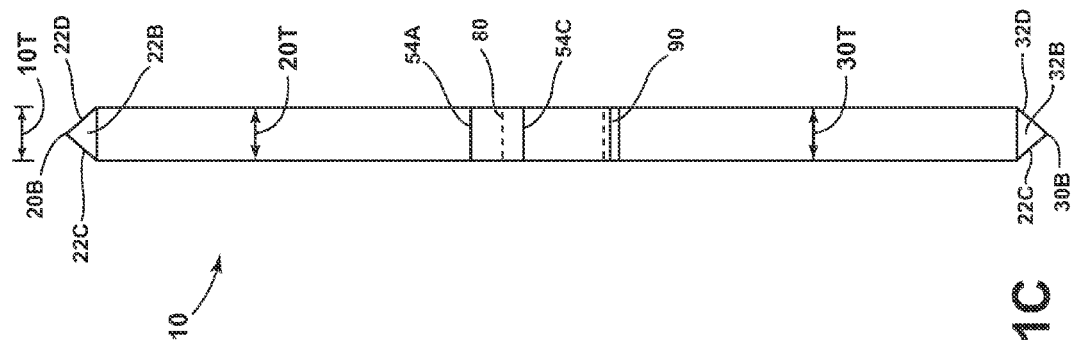
FIG. 1C is a side view of an embodiment of a semi-compliant terminal in accordance with teachings of the present disclosure.

Referring to the drawings, FIGS. 1A, 1B, and 1C generally illustrate embodiments of a semi-compliant terminal 10. Semi-compliant terminal 10 may include one or more of a variety of shapes, sizes, and/or configurations. In embodiments, semi-compliant terminal 10 may include a first portion 20, a second portion 30, and/or a middle portion 40. First portion 20 and second portion 30 may be located on opposite sides of middle portion 40. First portion 20 and/or second portion 30 may comprise blade portions and/or connector portions.

First portion 20 and/or second portion 30 may include a portion having a generally rectangular shape. The width 20W of first portion 20 and/or the width 30W of second portion 30 may be substantially constant and/or may be configured to correspond to the width 108W of a corresponding aperture 108 in a circuit board (e.g., circuit board 100). First portion 20 may include a length 20L and/or second portion 30 may include a length 30L. Length 20L and length 30L may be unequal or may be substantially equal. In embodiments, lengths 20L, 30L may be substantially longer than the length 40L of middle portion 40. For example, and without limitation, length 20L and/or length 30L may individually be at least twice as long as or longer than length 40L. First portion 20 may include outer walls 20A, 20B, 20C. Second portion 30 may include outer walls 30A, 30B, 30C.

In embodiments, first portion 20 and/or second portion 30 may include an end portion, such as end portions 22, 32. The width (e.g., 20W, 30W) and/or the thickness (e.g., 20T, 30T) of first portion 20 and/or second portion 30 may vary and/or taper with respect to end portions 22, 32, respectively. For example, and without limitation, with respect to end portion 22, width 20W of first portion 20 may decrease as the distance from middle portion 40 increases. Additionally or alternatively, thickness 20T of first portion 20 may decrease as the distance from middle portion 40 increases.

Middle portion 40 may include a first middle section 50, a second middle section 60, an aperture 80, and/or a transition portion 90. Middle portion 40 may include a length 40L and/or may include one or more widths, which may correspond to width 50W of first middle section 50 and/or width 60W of second middle section 60.

First middle section 50 may include a width 50W, which may be wider than width 20W of first portion 20 and/or width 30W of second portion 30. For example, and without limitation, first middle section 50 may include one or more tabs, such as, for example, first tabs 52, 54, and/or first middle section 50 may be referred to herein as a first tabbed portion 50. Width 50W of first middle section 50, which may include first tabs 52, 54, may be configured so that it is at least as wide or wider than width 108W of corresponding aperture 108 in a circuit board (e.g., circuit board 100). In embodiments, second middle section 60 may include one or more tabs, such as, for example, second tabs 62, 64, and/or second middle section 60 may be referred to as a second tabbed portion 60. In embodiments, width 60W of second middle section 60, which may include second tabs 62, 64, may be wider than width 20W of first portion 20 and/or width 30W of second portion 30. Width 60W of second middle section 60 may be less wide than width 50W of first middle section 50. Width 60W of second middle section 60 may be provided within a desired dimensional range, such as within a tolerance range and/or width 60W of second middle section 60 may generally correspond to a corresponding aperture 108 in a circuit board (e.g., circuit board 100). For example, and without limitation, width 60W of second middle section 60 may be slightly wider than, substantially the same as, or slightly less wide than a corresponding aperture 108. In embodiments, width 60W of second middle section 60 may vary according to variations in a manufacturing process of semi-compliant terminal 10.

In embodiments, first middle section 50 may include length 50L and/or second middle section 60 may include length 60L. Length 60L may be substantially equal to length 50L, length 60L may be shorter than length 50L, or length 60L may be longer than length 50L. For example, and without limitation, length 60L may be about twice as long as length 50L.

In embodiments, terminal 10 may be configured such that if terminal 10 is inserted into aperture 108, for example, of a circuit board (e.g., circuit board 100), some or all of the outer walls of terminal 10 (e.g., outer walls 66A, 68A) may rub against an aperture 108 of the circuit board without contacting a substrate 102 of the circuit board. For example, and without limitation, width 60W may be substantially the same as width 108W, which may cause outer walls 66A, 68B to rub against material 96, which may be plated in rounded portions of aperture 108. Outer walls 66A, 68A may rub against material 96 without rubbing against substrate 102.

In embodiments, middle portion 40 may include an aperture 80. Aperture 80 may extend in first middle section 50 and/or second middle section 60. Aperture 80 may include one or more of a variety of shapes and/or configurations, and may include, such as, for example, a generally rectangular and/or elongated oval shape. A longitudinal axis 82 of aperture 80 may be generally parallel to and/or may be generally aligned with longitudinal axis 12 of semi-compliant terminal 10. Aperture 80 may include a length 80L and/or a width 80W.

In embodiments, second middle section 60 may include first side wall 66 and/or second side wall 68. First side wall 66 and second side wall 68 may be generally disposed on opposite sides of aperture 80. As generally illustrated in FIG. 1B, first side wall 66 and/or second side wall 68 may be configured to deflect if semi-compliant terminal 10 is inserted into a circuit board (e.g., circuit board 100). A deflection may include portions of a side wall (e.g., side wall 66 and/or 68) moving toward and/or away from axis 12. As generally illustrated in FIG. 1B, a deflection may include curving and/or angling of one or more portions of a side wall. A deflection may occur in substantially one plane (e.g., thickness 10T may remain the same) or deflection may occur in more than one plane (e.g., thickness 10T may increase). A deflection may be configured to compensate for manufacturing inconsistencies and/or may permit the terminal to be semi-compliant. If semi-compliant terminal 10 is removed from a circuit board (e.g., circuit board 100), side walls 66, 68 may remain in a deflected state and may not return to their original orientation (e.g., deflection may be permanent). A deflection of a sidewall without the sidewall returning to its original orientation may correspond to the sidewall being semi-compliant. A fully-compliant sidewall may deflect and return to its original orientation if it is removed from a circuit board. A non-compliant sidewall may not deflect if it is removed from a circuit board.

In embodiments, side walls 66, 68 may deflect inwardly if terminal 10 is inserted into a circuit board (e.g., circuit board 100) and/or in response to an applied force. A deflection may correspond to a temporary holding feature, which may be configured to at least temporarily hold semi-compliant terminal 10 in place with respect to a circuit board (e.g., circuit board 100), which may allow for semi-compliant terminal 10 to be soldered and/or attached to a circuit board 100. A temporary holding feature may help maintain semi-compliant terminal 10 in a desired orientation relative to a circuit board 100, such as, for example, in a perpendicular orientation. A perpendicular orientation may include a semi-compliant terminal 10 being perpendicular a circuit board 100. For example, and without limitation, a plane of semi-compliant terminal 10 (e.g., a plane extending in the direction of width 20W) may be substantially parallel with the X-Z plane and the plane 100P of a circuit board 100 may be substantially parallel to the X-Y plane.

In embodiments, first side wall 66 may include a length 66L and second side wall 68 may include a length 68L, which may be substantially the same as or may be different from length 66L of first side wall 66. In embodiments, first side wall 66 and/or second side wall 68 may be configured to maintain or help maintain semi-compliant terminal 10 in a particular orientation relative to a circuit board (e.g., circuit board 100). For example, and without limitation, first side wall 66 and/or second side wall 68 may be substantially parallel to longitudinal axis 12.

In embodiments, first side wall 66 and/or second side wall 68 may be parallel to longitudinal axis 12 and may include lengths (e.g., 66L, 68L) that may be substantially equal to a thickness of a circuit board (e.g., thickness 100T of circuit board 100) and/or thickness 102T of a substrate 102. Compared to embodiments in which first side wall 66 and second side wall 68 include lengths shorter than the thickness of a circuit board (e.g., thickness 100T and/or a thickness 102T of substrate 102) and/or that are not parallel to the longitudinal axis 12, first side wall 66 and second side wall 68 including lengths substantially equal to a thickness 100T of a circuit board 100 and/or a thickness 102T of a substrate 102 and being disposed parallel to longitudinal axis 12 may increase the effectiveness of a holding feature, which may better maintain semi-compliant terminal 10 in a desired and/or parallel orientation relative to a circuit board (e.g., circuit board 100). Embodiments may include shorter side walls and/or ramped side walls, which may allow for additional movement and/or play of semi-compliant terminal 10 within an aperture 80, which may not be desirable. In embodiments, first side wall 66 may include an outer wall 66A and/or second side wall 68 may include an outer wall 68A.

Width 66W of first side wall 66, and/or width 68W of second side wall 68 may generally correspond to width 80W of aperture 80 and/or to a desired amount of deflection. For example, and without limitation, as width 80W of aperture 80 increases, widths 66W, 68W, of side walls 66, 68 may decrease, which may correspond to greater deflection, and/or as width 80W of aperture 80 decreases, the widths 66W, 68W of side walls 66, 68 may increase, which may correspond to decreased deflection.

Additionally or alternatively, in embodiments, tab 52 may include outer walls 52A,B,C, and/or tab 54 may include outer walls 54A,B,C. One or more of outer walls 52A,B,C, 54A,B,C may be substantially parallel to and/or substantially perpendicular to longitudinal axis 12.

In embodiments, semi-compliant terminal 10 may include one or more portions 90. Transition portion 90 may correspond to an angled and/or curved portion, which may be disposed between middle portion 40, which may be relatively wide, and second portion 30, which may be relatively skinny. Transition portion 90 may include some curvature and/or rounding in or near an intersection with middle portion 40 and/or second portion 30. Transition portion 90 may be disposed such that when semi-compliant terminal 10 is inserted into a circuit board (e.g., circuit board 100), transition portion 90 may be generally aligned with a first surface 104A or a second surface 104B of a circuit board 100. Transition portion 90 may or may not include a ramped or inclined portion. For example, in an embodiment in which transition portion 90 does not include a ramped or inclined portion, transition portion 90 may provide the width of semi-compliant terminal 10 with a substantially immediate transition from the width 30W of second portion 30, which may be substantially constant, to width 60W of second middle section 60, which may be substantially constant. A width of semi-compliant terminal 10 may vary across its length and/or correspond to one or more of the widths of its various portions, such as, for example, widths 20W, 30W, 40W, 50W, and/or 60W.

As generally illustrated in FIG. 1C, in embodiments, semi-compliant terminal 10 may include a shape that may be substantially constant across its thickness 10T. Thickness 10T may be thinner, substantially equal to, or thicker than the widest portion of terminal 10, which may be at first middle section (e.g., terminal 10 may include portions that may be thicker than they are wide, about as thick as they are wide, and/or thinner than they are wide). For example, and without limitation, thickness 10T may be two or more times smaller than width 50W (e.g., terminal 10 may be at least twice as wide as it is thick).

In embodiments, an overall shape of semi-compliant terminals (e.g., semi-compliant terminal 10) may vary in one or more portions. For example, and without limitation, a shape of semi-compliant terminal 10 may be substantially constant across its thickness, except in end portions 22, 32. In embodiments, semi-compliant terminal 10 may be symmetric relative to longitudinal axis 12.

In embodiments, and as generally illustrated in FIG. 2A, semi-compliant terminal 110 may include a first portion 120, a second portion 130, and a middle portion 140, which may include two or more apertures such as, for example, aperture 180 and/or aperture 182. First portion 120 may include a length 120L and/or a width 120W. Width 120W of first portion 120 may be substantially constant along length 120L. Second portion 130 may include a length 130L and/or a width 130W. Width 130W of second portion 130 may be substantially constant along length 130L. First portion 120 may include outer walls 120A, 120B, 120C. Second portion 130 may include outer walls 130A, 130B, 130C.

In embodiments, first portion 120 and/or second portion 130 may include an end portion, such as end portions 122, 132. The width and/or thickness of first portion 120 and/or second portion 130 may taper with respect to and/or near end portions 122, 132, respectively. For example, and without limitation, with respect to end portion 122, width 120W of first portion 120 may decrease as a distance from middle portion 140 increases. Additionally or alternatively, the thickness 120T of first portion 120 may decrease as a distance from middle portion 140 increases. Thickness 130T of second portion may decreases as the distance from middle portion 140 increases.

Middle portion 140 may include a first middle section 150 and/or a second middle section 160. Middle portion 140 may include a length 140L and/or may include one or more widths, which may correspond to the width 150W of first middle section 150 and/or the width 160W of second middle section 160.

In embodiments, first middle section 150 may include a length 150L and/or second middle section 160 may include a length 160L. Length 160L may be shorter than length 150L, substantially equal to length 150L, or length 160L may be longer than length 150L. For example, and without limitation, length 160L may be at least about twice as long as length 150L.

In embodiments, terminal 110 may be configured such that if terminal 110 is inserted into an aperture of a circuit board (e.g., aperture 108 of circuit board 100), some or all of the outer walls of terminal 110 (e.g., outer walls 166A, 168A) may rub against an aperture of a circuit board without contacting a substrate 102 of the circuit board. For example, and without limitation, width 160W may be substantially the same as width 108W, which may cause outer walls 166A, 168A to rub against material 96 plated in rounded portions of aperture 108 without rubbing against substrate 102.

First middle section 150 may include a width 150W that is wider than width 120W of first portion 120 and/or width 130W of second portion 130. For example, and without limitation, first middle section 150 may include one or more tabs, such as, for example, first tabs 152, 154, and/or first middle section 150 may be referred to herein as first tabbed portion 50. Width 150W of first middle section 150, which may include first tabs 152, 154, may be configured so that it is wider than width 106W of a corresponding aperture 106 in a circuit board (e.g., circuit board 100).

In embodiments, middle portion 140 may include first side wall 166, second side wall 168, and/or middle wall 170. First side wall 166 and middle side wall 170 may be generally disposed on opposite sides of aperture 180 and/or second side wall 168 and middle side wall 170 may be generally disposed on opposite sides of aperture 182. As generally illustrated in FIGS. 2B and 4B, if semi-compliant terminal 110 is inserted into a circuit board (e.g., circuit board 100) and/or a force is applied to terminal 110, first side wall 166 and/or second side wall 168 may be configured to flex and/or deflect. Deflection and/or flexing may include portions of a side wall (e.g., side wall 166 and/or 168) moving toward and/or away from axis 112. As generally illustrated in FIG. 2B, deflection may include curving and/or angling of one or more portions of a side wall. Deflection may occur in substantially one plane (e.g., thickness 110T may remain the same) or deflection may occur in more than one plane (e.g., thickness 110T may increase). A deflection may be configured to compensate for manufacturing inconsistencies and/or may correspond to a terminal being semi-compliant.

Middle wall 170 may include at least some resiliency, which may include being configured to resist flexing and/or deflection and/or may include being configured to not significantly flex or deflect if terminal 110 is inserted into a circuit board (e.g., circuit board 100) and/or if a force is applied to terminal 110. Middle wall 170 may include a length 170L, which may correspond to one or more of the lengths 180L, 182L of apertures 180, 182.

In embodiments, deflection of side wall 166 and/or side wall 168 may comprise or correspond to a temporary holding feature, which may be configured to temporarily hold semi-compliant terminal 110 in place with respect to a circuit board (e.g., circuit board 100). A temporary holding feature may allow for semi-compliant terminal 110 to be soldered and/or attached to a circuit board (e.g., circuit board 100). The temporary holding feature may help maintain semi-compliant terminal 110 in a desired orientation relative to a circuit board (e.g., circuit board 100), such as, for example, in a perpendicular orientation. A perpendicular orientation may include a semi-compliant terminal 110 being perpendicular to a circuit board (e.g., circuit board 100). For example, and without limitation, a plane of semi-compliant terminal 110 (e.g., the plane extending in the direction of width 120W) may be substantially parallel with the X-Z plane and the plane 100P of a circuit board 100 (e.g., a plane parallel to surface 104A and/or 104B) may be substantially parallel to the X-Y plane.

In embodiments, a deflection of side wall 166 and/or side wall 168 may be configured to compensate for manufacturing inconsistencies and/or may correspond to terminal 110 being semi-compliant. If semi-compliant terminal 110 is removed from circuit board 100, side walls 166, 168 may remain in a deflected state (e.g., as generally illustrated in FIG. 2B) and may not return to their original orientation (e.g., deflection may be permanent).

The width 166W of first side wall 166, the width 168W of second side wall 168, and/or the width 170W middle wall 170 may generally correspond to width 180W of aperture 180, the width 182W of aperture 182, and/or to a desired amount of deflection. For example, and without limitation, as widths 180, 182 of apertures 180, 182 increase, widths 166W, 168W, 170W of walls 166, 168, 170 may decrease, which may correspond to greater deflection, and/or as widths 180, 182 of apertures 180, 182 decrease, widths 166W, 168W, 170W of walls 166, 168, 170 may increase, which may correspond to decreased deflection. In embodiments, width 170W of middle wall 170 may remain constant regardless of widths 180W, 182W of apertures 180, 182 and/or regardless of widths 166W, 168W of first side wall 166 and second side wall 168.

In embodiments, longitudinal axis 180A of aperture 180 and/or longitudinal axis 182A of aperture 182 may be generally parallel to longitudinal axis 112 of semi-compliant terminal 110. Apertures 180, 182 may be disposed at equal distances from longitudinal axis 180A, 182A or apertures 180, 182 may be disposed at different distances from longitudinal axis 112. A distance 180D that aperture 180 may be disposed away from longitudinal axis 112 and/or a distance 182D that aperture 182 may be disposed away from longitudinal axis 112 (e.g., the distance from the longitudinal axis 180A, 182A of the aperture to longitudinal axis 112) may correspond to a desired amount of deflection. For example, and without limitation, embodiments in which apertures 180, 182 may be disposed closer to longitudinal axis 112 may correspond to less deflection and/or embodiments in which apertures 180, 182 may be disposed farther from longitudinal axis 112 may correspond to greater deflection.

In embodiments, apertures 180, 182 may include lengths 180L, 182L, respectively, and/or apertures 180, 182 may include widths 180W, 182W, respectively. Widths 180W, 182W of apertures 180, 182 may be substantially constant along their respective lengths 180L, 182L, or width 180W of aperture 180 and/or width 182W of aperture 182 may vary along their respective lengths 180L, 182L. Lengths 180L, 182L of apertures 180, 182 may be substantially equal or unequal.

In embodiments, it may be desirable for middle portion 140 to include two or more apertures 180, 182 in some applications in which width 120W may be relatively wide and/or in which width 130W may be relatively wide. Embodiments with two or more apertures (e.g., apertures 180, 182) may provide for greater potential deflection as compared to embodiments with a single aperture (e.g., aperture 80 of terminal 10) and may also provide greater structural integrity, such as, without limitation, greater strength in a direction of the longitudinal axis 112. Greater structural integrity may help prevent first side wall 166 and/or second side wall 168 from completely collapsing during insertion and/or help prevent length 150L of middle section 150 from substantially decreasing during insertion. In embodiments, middle wall 170 may be configured to provide greater structural integrity.

Figure 2D:
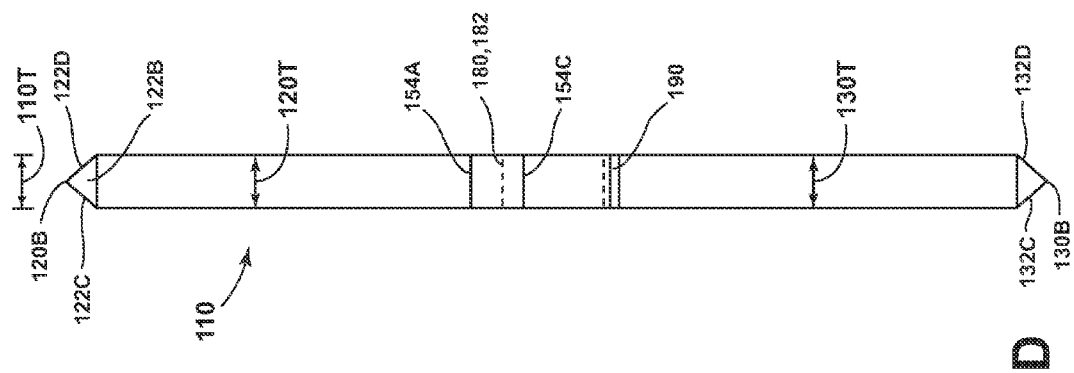
FIG. 2D is a side view of an embodiment of a semi-compliant terminal in accordance with teachings of the present disclosure.

As generally illustrated in FIG. 2D, in embodiments, semi-compliant terminal 110 may include a shape that is substantially constant across its thickness 110T. Thickness 110T may be thinner, substantially equal to, or thicker than the widest portion of terminal 110, which may be at first middle section (e.g., width 150W). For example, and without limitation, thickness 110T may be at least two times smaller than width 150W (e.g., terminal 110 may include portions that are at least twice as wide as they are thick).

In embodiments, an overall shape of semi-compliant terminals may vary in one or more areas. For example, and without limitation, a shape of semi-compliant terminal 110 may be substantially constant across its thickness, except in end portions 122, 132. Semi-compliant terminal 110 may be symmetric relative to longitudinal axis 112.

In embodiments, semi-compliant terminal 110 may include one or more transition portions 190. Transition portion 190 may correspond to a generally angled and/or curved portion, and/or may be disposed between middle portion 140, which may be relatively wide, and second portion 130, which may be relatively less wide. Transition portion 190 may include some curvature and/or rounding, which may be in or near an intersection with middle portion 140 and/or second portion 130. Transition portion 190 may be disposed such that if semi-compliant terminal 110 is inserted into a circuit board (e.g., circuit board 100), transition portion 190 may be generally aligned with a first surface 104A or a second surface 104B of a circuit board (e.g., circuit board 100). Transition portion 190 may or may not include a ramped and/or inclined portion. For example, in embodiments in which transition portion 190 does not include an angled and/or ramped portion, transition portion 190 may provide the width of semi-compliant terminal 110 with a substantially immediate transition from width 130W of the second portion 130, which may be substantially constant, to the width 160W of second middle section 160, which may be substantially constant and/or wider than width 130W.

In embodiments, all of the outer walls (e.g., outer walls 52A,B,C, 54A,B,C, 66A, 68A, 152A,B,C, 154A,B,C, 166A, and/or 168A) of a middle portion (e.g., middle portion 40 and/or 140) may be substantially parallel to or perpendicular to the longitudinal axis (e.g., axis 12 and/or 112) of a semi-compliant terminal (e.g., terminal 10 and/or 110). For example, and without limitation, in embodiments, all of outer walls 152A,B,C, 154A,B,C, 166A, and 168A of semi-compliant terminal 110 may be substantially parallel to or perpendicular to longitudinal axis 112 of semi-compliant terminal 110. In embodiments, all of outer walls 120A,B,C, 130A,B,C, 152A,B,C, 154A,B,C, excluding outer walls 122A,B,C,D of end portion 122 and outer walls 132A,B,C,D, of end portion 132, of a semi-compliant terminal 110, may be substantially parallel to or perpendicular to longitudinal axis 112 of semi-compliant terminal 110.

In embodiments, a semi-compliant terminal (e.g., 10, 110) in a non-deflected state may include outer walls (e.g., outer walls 152A,B,C, 154A,B,C, 166A, 168A) along the length of an aperture (e.g., 80, 180, and/or 182) and all of the outer walls may be perpendicular or parallel to longitudinal axis 112 and/or to plane 100P of a circuit board 100. For example, and without limitation, a semi-compliant terminal (e.g., terminal 10 and/or terminal 110) may not include any ramped outer walls along length 80L of aperture 80, along length 180L of aperture 180, along length 182L of aperture 182, and/or in middle portions 40, 140. In embodiments, outer walls 22A,B,C,D of end portion 22 at a first end of terminal 10 and/or outer walls 32A,B,C,D, of end portion 32 at the other end terminal 10 may comprise the only outer walls of a terminal 10, 110 that are not parallel or perpendicular to a longitudinal axis 12, 112.

Figure 3A:
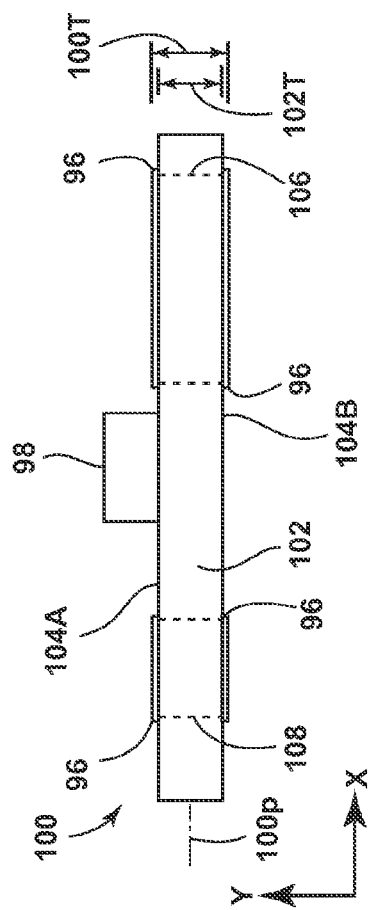
FIGS. 3A and 3B are side views of an embodiment of a circuit board in accordance with teachings of the present disclosure.
Figure 3B:
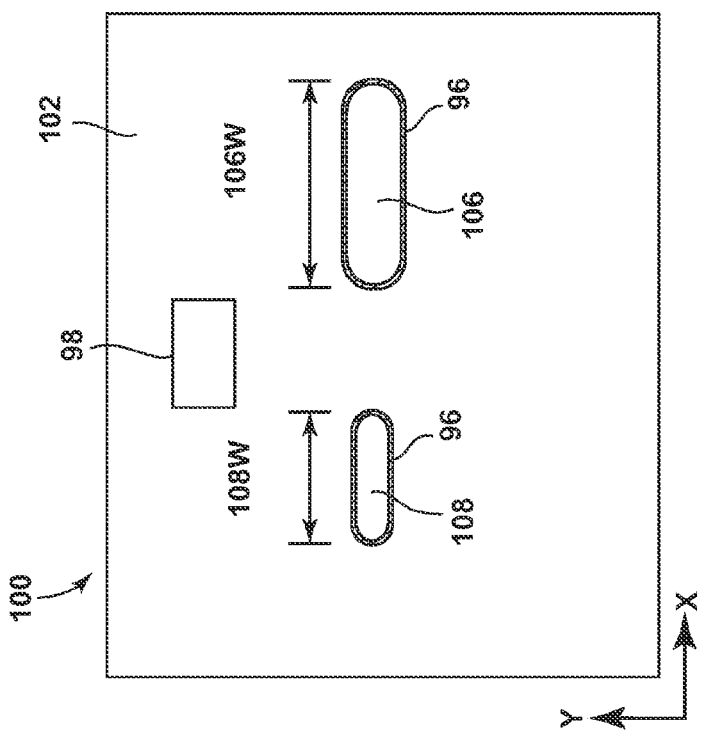

In embodiments, as generally illustrated in FIGS. 3A and 3B, circuit board 100 may include a substrate 102, which may include a first surface 104A, a second surface 104B, and/or one or more apertures 106, 108. Circuit board 100 may include one or more of a variety of shapes, sizes, and/or configurations. Circuit board 100 may include a thickness 100T, which may be substantially constant or may vary across the surface area of a circuit board 100.

In embodiments, portions or all of a substrate 102 may be covered with a material 96, which may be a conductive material. For example, and without limitation, substrate 102 may include areas plated with a metal, such as copper. In embodiments, apertures 106, 108 may be plated with copper 96 such that copper 96 covers an area around (e.g., surrounding) apertures 106, 108 on first surface 104A, on second surface 104B, and/or such that copper 96 extends into apertures 106, 108 and/or covers the thickness 102T of a substrate 102 in apertures 106, 108. Apertures 106, 108 may include one or more of a variety of shapes, size, and/or configurations. For example, and without limitation, apertures 106, 108 may include a generally rectangular and/or elongated shape. Apertures 106, 108 may include one or more rounded, curved, and/or angled portions.

In embodiments, one or more electrical components 98 may be connected and/or attached to substrate 102. For example, and without limitation, electrical components 98 may comprise one or more of resistors, capacitors, inductors, relays, switches, fuses, sensors, communication devices, and/or various other desired components.

As generally illustrated in FIGS. 4A and 4B, in embodiments, semi-compliant terminals 10, 110 may be configured to be inserted into apertures 108, 106, respectively, of a circuit board (e.g., circuit board 100). In embodiments, second portions 30, 130 may be configured to be easily inserted (e.g., with reasonable clearance) into apertures 108, 106, respectively. If a semi-compliant terminal (e.g., terminal 10 and/or terminal 110) is inserted farther into an aperture (e.g., aperture 106 and/or 108), middle portions 40, 140 may approach a surface (e.g., first surface 104A or second surface 104B) of a circuit board (e.g., circuit board 100). In embodiments, second middle sections 50, 150 may be configured to be fully inserted into apertures 108, 106, respectively, which may cause the entire length of first side walls 66L 166L and/or the entire length of second side walls 68L, 168L to be generally aligned with the entire thickness 100T of a circuit board 100 and/or thickness 102T of a substrate 102. The alignment of the entire lengths 66L, 166L of first side walls 66, 166 and/or the entire lengths 68L, 168L of second side walls 68, 168 may correspond to a greater removal force required to remove an inserted terminal 10, 110 from circuit board 100. An increased removal force may be desirable for some application to help prevent unintended removal, such as, for example, when a circuit board (e.g., circuit board 100) is being used and/or has been installed.

In embodiments, if a second middle section (e.g., second middle section 50 and/or second middle section 150) is fully inserted into an aperture (e.g., aperture 106 and/or aperture 108) such as, for example, as generally illustrated in FIG. 4B, a middle portion 40, 140 may be disposed such that at least a portion of a first middle section 50, 150 (e.g., outer wall 52C, 152C, 54C, and/or 154C) may be disposed in contact with first surface 104A and/or such that transition portion 190 may be aligned with second surface 104B.

In embodiments, circuit board 100 may include aperture 106, aperture 108, and/or electrical components 96. Semi-compliant terminal 10 may be fully inserted into aperture 108 and/or semi-compliant terminal 110 may be fully inserted into aperture 106. Semi-compliant terminals 10, 110 may each include a temporary holding feature that may at least temporarily maintain each in a perpendicular orientation relative to a circuit board (e.g., circuit board 100).

In embodiments, semi-compliant terminal 210 may include a first portion 220, a second portion 230, and/or a middle portion 240. First portion 220 and second portion 230 may be located on opposite sides of middle portion 240. First portion 220 and/or second portion 230 may comprise blade portions and/or semi-compliant terminal 210 may comprise a double blade terminal. First portion 220 and/or second portion 230 may include connector portions.

Figure 5B:
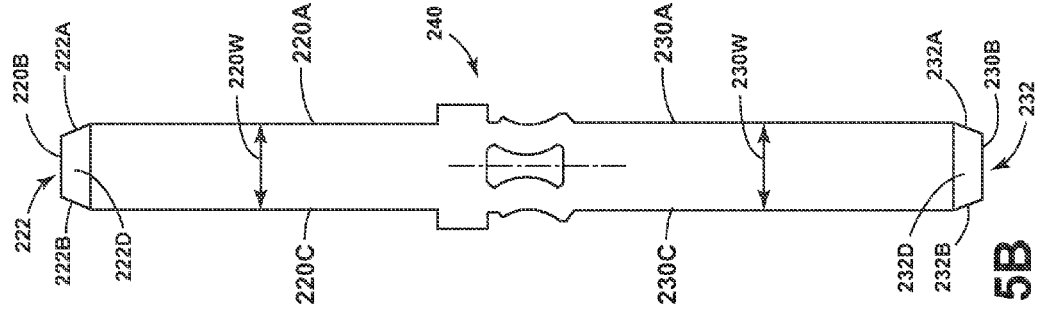
FIGS. 5A and 5B are side views of embodiments of semi-compliant terminals and circuit boards of in accordance with teachings of the present disclosure.
Figures 5C, 5D:
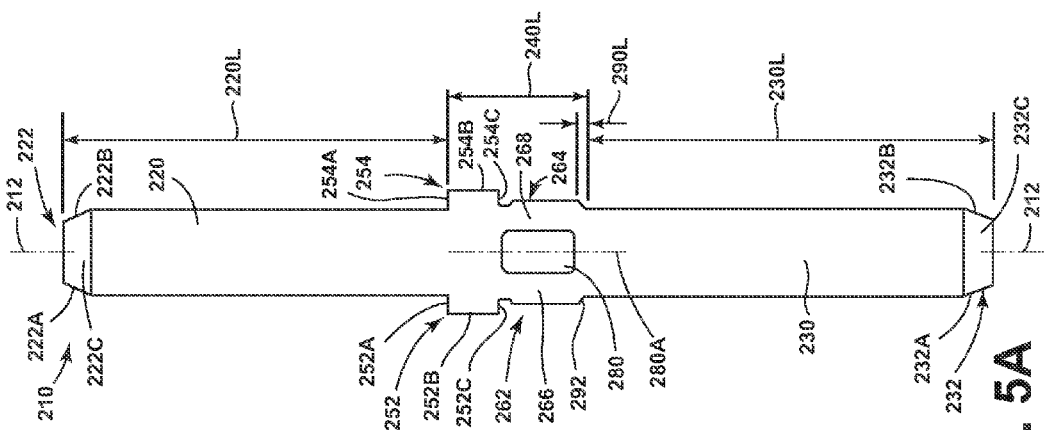
FIGS. 5C and 5D are side views of portions of embodiments of a semi-compliant terminal in accordance with teachings of the present disclosure.
Figure 5A:
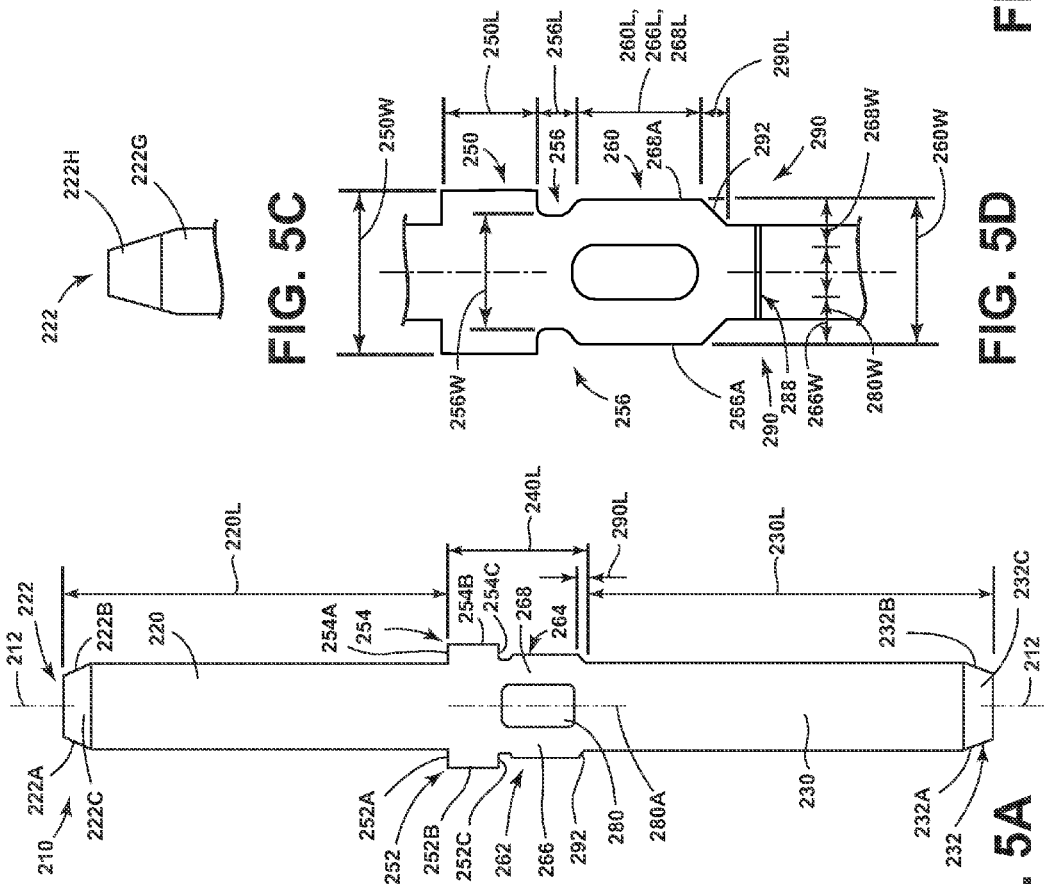
Figure 8B:
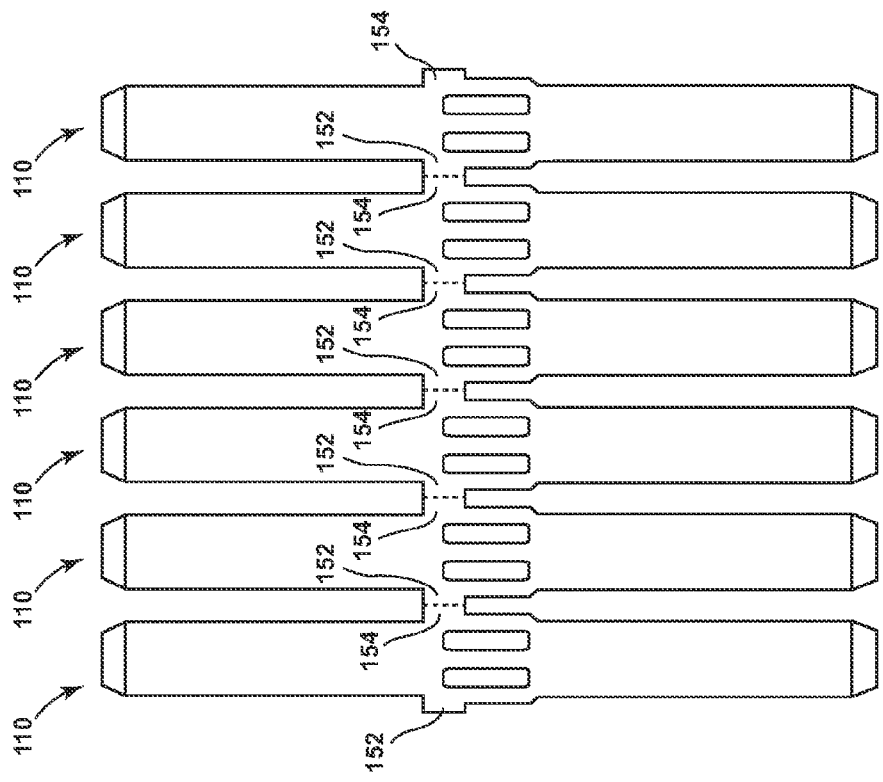
FIGS. 8A-8D are side views of embodiments of semi-compliant terminals in accordance with teachings of the present disclosure.
Figure 8A:
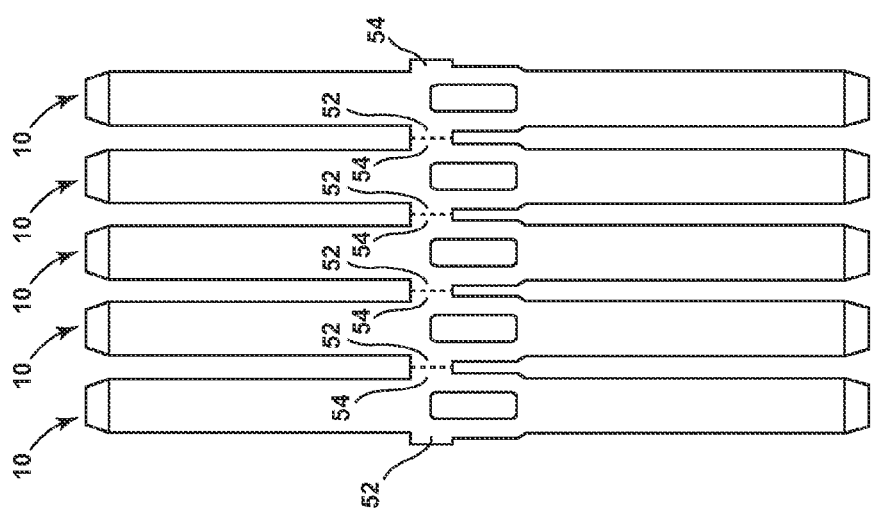
Figure 8D:
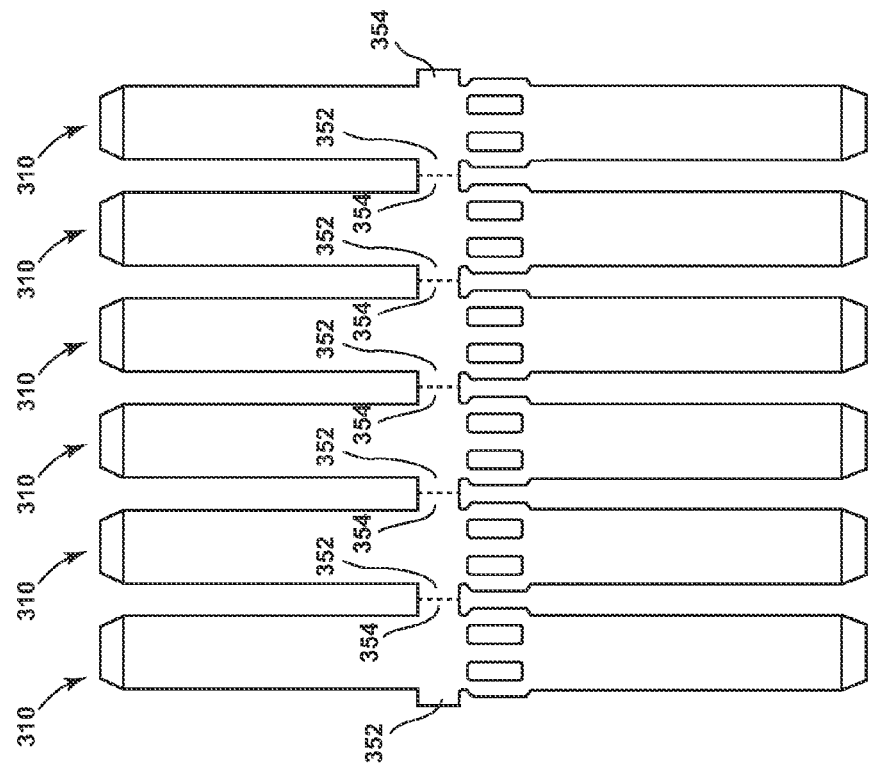
Figure 8C:
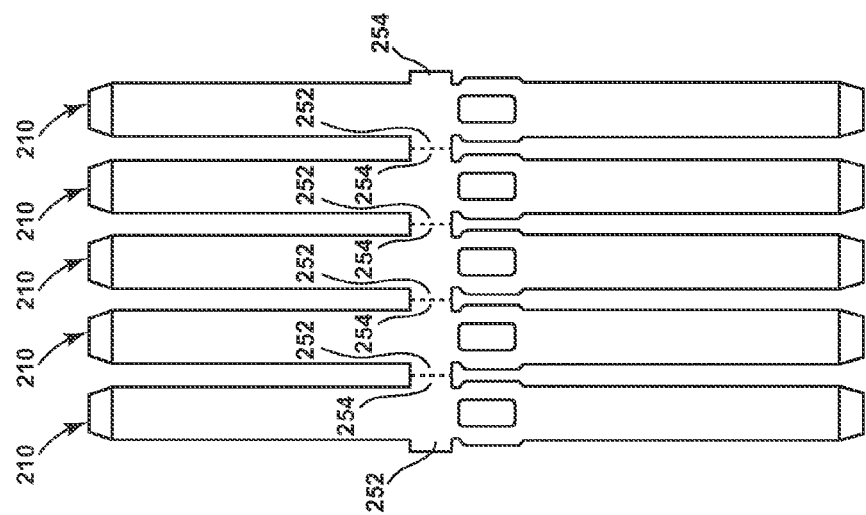

As generally illustrated in FIGS. 5A, 5B, 5D, in embodiments, semi-compliant terminal 210 may include a recessed portion between tabbed portions 252 and 262 and/or a recessed portion between tabbed portions 254 and 264.

First portion 220 and/or second portion 230 may include a generally rectangular shape. The width 220W of first portion 220 and/or the width 230W of second portion 230 may be substantially constant and may be configured to be less wide than the width 108W of corresponding aperture 108 in a circuit board (e.g., circuit board 100). First portion 220 may include a length 220L and/or second portion 230 may include a length 230L. Length 220L and length 230L may be substantially equal to each other or length 220L and length 230L may not be equal to each other. Length 220L and/or length 230L may be substantially longer than the length 240L of middle portion 240. For example, and without limitation, length 220L and/or length 230L may be at least twice as long as length 240L. First portion 220 may include outer walls 220A, 20B, 220C. Second portion 230 may include outer walls 230A, 230B, 230C.

In embodiments, as generally illustrated in FIGS. 5A, 5B, 5C, 5E, first portion 220 and/or second portion 230 may include an end portion, such as end portions 222, 232. End portion 222 may include outer walls 222A, 222B, 222C, and/or 222D. End portion 232 may include outer walls 232A, 232B, 232C, and/or 232D.

In embodiments, as generally illustrated in FIGS. 5C and 5E, width 220W and/or thickness 220T of first portion 220 may vary and/or taper with respect to end portion 222. In embodiments, width 230W and/or thickness 230T of second portion 230 may vary and/or taper with respect to end portion 232. For example, and without limitation, with respect to end portion 222, width 220W of first portion 220 may decrease as the distance from middle portion 240 increases. Additionally or alternatively, the thickness 220T of first portion 220 may decrease as the distance from middle portion 240 increases.

In embodiments, as generally illustrated in FIG. 5C, thickness 220T of first portion 220 may remain constant in a first portion 222G of end portion 222 and/or may taper with respect to a second portion 222H. The width 220W of first portion 220 may taper with respect to first portion 222G and/or second portion 222H.

In embodiments, end portion outer walls may include one or more shapes, sizes, and/or configurations. For example, outer walls 222A,B,C,D may correspond to a generally trapezoidal shape and/or may be disposed such that width 220W decreases as the distance from middle portion 240 increases. As generally illustrated in FIG. 5E, in embodiments, outer wall 222A and/or 222B may correspond to a generally triangular shape, which may include one or more curved and/or rounded portions, such as, for example, curved portions 222E, 222F.

As generally illustrated in FIG. 5D, middle portion 240 may include a first middle section 250, a recessed portion 256, a second middle section 260, an aperture 280, and/or a transition portion 290. Middle portion 240 may include a length 240L and/or may include one or more widths, which may correspond to the width 250W of first middle section 250 the width 256W of recessed portion 256, and/or the width 260W of second middle section 260.

Width 250W of first middle section 250 may be wider than width 220W of first portion 220 and/or the width 230W of second portion 230. In embodiments, first middle section 250 may include one or more tabs, such as, for example, first tabs 252, 254. Width 250W of first middle section 250, which may include first tabs 252, 254, may be configured so that it is at least as wide or wider than width 108W of corresponding aperture 108 in a circuit board (e.g., circuit board 100).

In embodiments, second middle section 260 may include one or more tabs, such as, for example, second tabs 262, 264. In embodiments, width 260W of second middle section 260, which may include second tabs 262, 264, may be greater than width 220W of first portion 220 and/or width 230W of second portion 230. Width 260W of second middle section 260 may be less wide than width 250W of first middle section 250. Width 260W of second middle section 260 may be provided within a desired dimensional range, such as within a tolerance range and/or width 260W of second middle section 260 may generally correspond to corresponding aperture 108 in a circuit board (e.g., circuit board 100). For example, and without limitation, width 260W of second middle section 260 may be slightly wider than, substantially the same as, or slightly less wide than corresponding aperture 108. In embodiments, width 260W of second middle section 260 may vary according to variations in the manufacturing process of semi-compliant terminal 210.

In embodiments, first middle section 250 may include a length 250L and/or second middle section 260 may include a length 260L. Length 260L may be substantially equal to length 250L, length 260L may be shorter than length 250L, or length 260L may be longer than length 250L. For example, and without limitation, length 260L may be about twice as long as length 250L.

In embodiments, terminal 210 may be configured such that if terminal 210 is inserted into aperture 108 of a circuit board (e.g., circuit board 100), some or all of the outer walls of terminal 210 (e.g., outer walls 266A, 268A) may rub against aperture 108 of a circuit board 100 without contacting substrate 102 of a circuit board 100. For example, and without limitation, width 260W may be substantially the same as width 108W, which may cause outer walls 266A, 268B to rub against the material 96 plated in rounded portions of aperture 108 without rubbing against or through to substrate 102.

In embodiments, middle portion 240 may include one or more recessed portions 256. A recessed portion 256 may be disposed between first middle section 250 and second middle section 260. Recessed portion 256 may be configured to reduce a length 260L of second middle section 260, which may reduce the press length of semi-compliant terminal 210. For example, and without limitation, a press length may correspond to a portion of a terminal that may require relatively more force during insertion of the terminal into an aperture (e.g., apertures 106, 108) relative to other portions of the terminal. Recessed portion 256 may, additionally or alternatively, provide space for material 96, which may permit the terminal 210 (e.g., walls 252C, 254C) to be flush to a circuit board (e.g., circuit board 100). Recessed portion may include a length 256L and/or a width 256W. Width 256W may be less wide than width 250W and/or width 260W. In embodiments, width 256W and/or length 256L may be configured (e.g., width 256W may be relatively less wide and/or length 256L may be relatively long) to provide space for a plowed material (e.g., a conducting material, such as copper) to seat, which may allow terminal 210 to be flush to circuit board 100 (e.g., outer walls 254C, 256C may be in direct contact with circuit board 100 and/or substrate 102).

In embodiments, middle portion 240 may include an aperture 280. Aperture 280 may include one or more of a variety of shapes and/or configurations, and may include, such as, for example, a generally rectangular and/or elongated oval shape. A longitudinal axis 280A of aperture 280 may be generally parallel to and/or may be generally aligned with longitudinal axis 212 of semi-compliant terminal 210. Aperture 280 may include a length 280L and/or a width 280W. In embodiments, length 280L may be relatively short (e.g., relative to length 80L of aperture 80 of terminal 10 and/or lengths 180L, 182L of apertures 180, 182 of terminal 110) and/or may correspond to a thickness (e.g., thickness 100T and/or thickness 102T) of a circuit board (e.g., circuit board 100) and/or of a substrate (e.g., substrate 102). In embodiments, length 280L may be configured to be smaller than a thickness 100T of a circuit board 100 and/or thickness 102T of a substrate 102, which may reduce and/or prevent a solder mask from passing through aperture 280. For example, and without limitation, aperture 380 may be disposed such that its entire length 380L is covered by thickness 100T and/or thickness 102T of a substrate 102 (e.g., between surfaces 104A and 104B) if terminal 210 is inserted into a circuit board (e.g., circuit board 100). Aperture 280 may extend in recessed portion 256 and/or second middle section 260. In embodiments, as generally illustrated in FIG. 5D, aperture 280 may extend in second middle section 260 and/or recessed portion 256, and/or may not extend in first middle section 250 and/or transition portion 290.

In embodiments, second middle section 260 may include a first side wall 266 and/or a second side wall 268. First side wall 266 and second side wall 268 may be generally disposed on opposite sides of aperture 280. As generally illustrated in FIG. 5B, first side wall 266 and/or second side wall 268 may be configured to deflect inwardly as semi-compliant terminal 210 is inserted into a circuit board (e.g., circuit board 100). A deflection may be configured to compensate for manufacturing inconsistencies and/or may permit terminal 210 to be semi-compliant. A deflection may include portions of a side wall (e.g., side wall 266 and/or 268) moving toward and/or away from axis 212. As generally illustrated in FIG. 5B, deflection may include curving and/or angling of one or more portions of a side wall. Deflection may occur in substantially one plane (e.g., thickness 210T may remain the same) or deflection may occur in more than one plane (e.g., thickness 210T may increase). A deflection may be configured to compensate for manufacturing inconsistencies and/or may correspond to the terminal being semi-compliant. If semi-compliant terminal 210 is removed from a circuit board (e.g., circuit board 100), side walls 266, 268 may remain in a deflected state and/or may not return to their original orientation (e.g. deflection may be permanent).

In embodiments, side walls 266, 268 may deflect inwardly (e.g., toward axis 212) during insertion of semi-compliant terminal 210 into an aperture, such as, for example, aperture 106 of a circuit board 100. A deflection may correspond to a temporary holding feature, which may be configured to temporarily hold semi-compliant terminal 210 in place with respect to a circuit board (e.g., circuit board 100), which may allow for semi-compliant terminal 210 to be soldered and/or attached to the circuit board. A temporary holding feature may help maintain semi-compliant terminal 210 in a desired orientation relative to a circuit board (e.g., circuit board 100), such as, for example, in a perpendicular orientation. A perpendicular orientation may include a semi-compliant terminal 210 being perpendicular to a circuit board 100. For example, and without limitation, a plane of semi-compliant terminal 210 (e.g., the plane extending in the direction of width 220W) may be substantially parallel with the X-Z plane and the plane 100P of a circuit board 100 may be substantially parallel to the X-Y plane.

In embodiments, first side wall 266 may include a length 266L and/or second side wall 268 may include a length 268L, which may be substantially the same as or may be different from the length 266L of first side wall 266. Lengths 266L, 268L may generally correspond to thickness 100T of a circuit board 100 and/or thickness 102T of a substrate 102. For example, and without limitation lengths 266L, 268L may be longer than, substantially the same as, or smaller than thickness 100T and/or thickness 102T of a substrate 102. In embodiments, first side wall 266 and/or second side wall 268 may be configured to maintain or help maintain semi-compliant terminal 210 in a particular orientation relative to a circuit board (e.g., circuit board 100). For example, and without limitation, first side wall 266 and/or second side wall 268 may be substantially parallel to longitudinal axis 212.

In embodiments, width 266W of first side wall 266, and/or the width 268W of second side wall 268 may generally correspond to width 280W of aperture 280 and/or to a desired amount of deflection. For example, and without limitation, as width 280W of aperture 280 increases, widths 266W, 268W, of side walls 266, 268 may decrease, which may correspond to greater deflection, and/or as the widths 280W of aperture 280 increase, the widths 266W, 268W of side walls 266, 268 may decrease, which may correspond to decreased deflection.

In embodiments, first side wall 266 may include an outer wall 266A and/or second side wall 268 may include an outer wall 268A. Additionally or alternatively, in embodiments, tab 252 may include outer walls 252A,B,C, and/or tab 254 may include outer walls 254A,B,C. Outer walls 252A,B,C and/or 254A,B,C may be substantially parallel to and/or substantially perpendicular to longitudinal axis 212.

In embodiments, semi-compliant terminal 210 may include one or more transition portions 290. Transition portion 290 may be configured for a transition between second middle section 260 and second portion 230. For example, and without limitation, second middle section width 260W may be wider than second portion width 230W and transition portion 290 may include an outer wall 292, which may be angled to transition between the two different widths. Transition portion 290 may include some curvature and/or rounding, which may be at or near its intersection with second middle section 260 and/or its intersection with second portion 230.

Transition portion 290 may be disposed such that when semi-compliant terminal 210 is inserted into a circuit board (e.g., circuit board 100), transition portion 290 may be generally covered by the thickness 100T of a circuit board 100 and/or thickness 102T of a substrate 102. For example, and without limitation, the thickness 100T of a circuit board 100 and/or thickness 102T of a substrate 102 may be at least as thick as a combined length of transition portion 290L, second middle section length 260L, and recessed portion length 256L. In embodiments, at least some of transition portion 290 may not be covered by thickness 100T of a circuit board 100 and/or thickness 100T of a circuit board 100 may be smaller than a combined length of transition portion length 290L, second middle section length 260L, and recessed portion length 256L.

As generally illustrated in FIG. 5E, in embodiments, semi-compliant terminal 210 may include a shape that is substantially constant across its thickness 210T. Thickness 210T may be thinner, substantially equal to, or thicker than the widest portion of terminal 210, which may be at first middle section (e.g., width 250W). For example, and without limitation, thickness 210T may be two or more times smaller than width 250W (e.g., terminal 210 may be at least two times wider than it is thick).

In embodiments, an overall shape of semi-compliant terminals may vary in one or more areas. For example, and without limitation, a shape of semi-compliant terminal 210 may be substantially constant across its thickness, except in end portions 222, 232. In embodiments, semi-compliant terminal 210 may be vertically symmetric relative to longitudinal axis 212.

In embodiments, semi-compliant terminal 210 may include an indent portion 288. Indent portion 288 may be disposed in second portion 230. Indent portion 288 may include an indent in a face of the semi-compliant terminal 210 and/or may correspond to a reduced thickness 210T of terminal 210 and/or thickness 230T may be reduced at and/or near indent portion 288. Indent portion 288 may be configured to help reduce and/or prevent solder wicking For example, and without limitation, indent portion 288 may be configured to act as a barrier and/or dam to slow or prevent solder from flowing along the surface of terminal 210 and/or from creating lumps of solder closer to end portion 232.

As generally illustrated in FIGS. 6A, 6B, 6D, in embodiments, semi-compliant terminal 310 may include a first portion 320, a second portion 330, and/or a middle portion 340. First portion 320 and second portion 330 may be located on opposite sides of middle portion 340. First portion 320 and/or second portion 330 may comprise blade portions and/or semi-compliant terminal 310 may comprise a double blade terminal.

In embodiments, first portion 320 and/or second portion 330 may include a generally rectangular shape. The width 320W of first portion 320 and/or the width 330W of second portion 330 may be substantially constant and may be configured to be less wide than width 108W of a corresponding aperture 108, for example, in circuit board 100. First portion 320 may include a length 320L and/or second portion 330 may include a length 330L. Length 320L and length 330L may be substantially equal to each other or length 320L and length 330L may be unequal. Lengths 320L, 330L may be substantially longer than the length 340L of middle portion 340. For example, and without limitation, length 320L and/or length 330L may be twice as long as length 340L. First portion 320 may include outer walls 320A, 320B, 320C. Second portion 330 may include outer walls 330A, 330B, 330C.

In embodiments, as generally illustrated in FIGS. 6A, 6B, 6C, 6E, first portion 320 and/or second portion 330 may include an end portion, such as end portions 322, 332. End portion 322 may include outer walls 322A, 322B, 322C, and/or 322D. End portion 332 may include outer walls 332A, 332B, 332C, and/or 332D.

In embodiments, the width 320W and/or the thickness 320T of first portion 320 may vary and/or taper with respect to end portion 322. In embodiments, the width 330W and/or the thickness 330T of second portion 330 may vary and/or taper with respect to end portion 332. For example, and without limitation, with respect to end portion 322, width 320W of first portion 320 may decrease as the distance from middle portion 340 increases. Additionally or alternatively, the thickness 320T of first portion 320 may decrease as the distance from middle portion 340 increases.

In embodiments, as generally illustrated in FIG. 6C, thickness 320T of first portion 320 may remain constant in a first portion 322G of end portion 322 and/or may taper with respect to a second portion 322H. Width 320W of first portion 320 may taper with respect to first portion 322G and/or second portion 322H.

In embodiments, end portion outer walls may include one or more shapes, sizes, and/or configurations. For example, outer walls 322A,B,C, D may generally correspond to a trapezoidal shape and/or may be disposed such that width 320W decreases as the distance from middle portion 340 increases. As generally illustrated in FIG. 6E, in embodiments, outer wall 322A and/or outer wall 322B may correspond to a generally triangular shape, which may include one or more curved and/or rounded portions, such as, for example, curved portions 322E, 322F.

In embodiments, middle portion 340 may include a first middle section 350, a recessed portion 356, a second middle section 360, an aperture 380, and/or a transition portion 390. Middle portion 340 may include a length 340L and/or may include a one or more widths, which may correspond to width 350W of first middle section 350, width 356W of recessed portion, and/or width 360W of second middle section 360.

In embodiments, first middle section 350 may include a width 350W that may be wider than the width 320W of first portion 320 and/or width 330W of second portion 330. For example, and without limitation, first middle section 350 may include one or more tabs, such as, for example, first tabs 352, 354, and/or first middle section 350 may be referred to herein as first tabbed portion 350. Width 350W of first middle section 350, which may include first tabs 352, 354, may correspond to width 108W of aperture 108, for example, in circuit board 100. For example, and without limitation, width 350W may be configured so that it is at least as wider or wider than width 108W.

In embodiments, second middle section 360 may include one or more tabs, such as, for example, second tabs 362, 364, and/or second middle section 360 may be referred to as second tabbed portion 360. In embodiments, width 360W of second middle section 360, which may include second tabs 362, 364, may be greater than width 320W of first portion 320 and/or width 330W of second portion 330. Width 360W of second middle section 360 may be less wide than width 350W of first middle section 350. Width 360W of second middle section 360 may be provided within a desired dimensional range, and/or width 360W may generally correspond to a corresponding aperture 108, for example, in circuit board 100. For example, and without limitation, width 360W may be slightly wider than, substantially the same as, or slightly less wide than width 108W of aperture 108. In embodiments, width 360W may vary according to variations in the manufacturing process of semi-compliant terminal 310.

In embodiments, first middle section 350 may include a length 350L and/or second middle section 360 may include a length 360L. Length 360L may be substantially equal to length 350L, length 360L may be shorter than length 350L, or length 360L may be longer than length 350L. For example, and without limitation, length 360L may be about twice as long as length 350L.

In embodiments, terminal 310 may be configured such that if terminal 310 is inserted into aperture 108, for example, of a circuit board 100, some or all of the outer walls of terminal 310 (e.g., outer walls 366A, 368A) may rub against aperture 108 of a circuit board 100 without contacting substrate 102 of a circuit board 100. For example, and without limitation, width 360W may be substantially the same as width 108W, which may cause outer walls 366A, 368A to rub against the material 96 plated in rounded portions of aperture 108 without rubbing against or through to substrate 102.

In embodiments, recessed portion 356 may include a length 356L and/or a width 356W. Recessed portion 356 may be disposed between first middle section 350 and second middle section 360, such as, for example, between tabbed portions 352 and 362 and/or between tabbed portions 354 and 364. Recessed portion 356 may be configured to reduce length 360L of second middle section 360, which may reduce the press length of semi-compliant terminal 310. A press length may generally correspond to length 360L of second middle section 360. Recessed portion 356 may, additionally or alternatively, provide space for material 96, which may permit the terminal 310 (e.g., walls 352C, 354C) to be flush to a circuit board (e.g., circuit board 100). Width 356W may be less wide than width 350W and/or width 360W. In embodiments, width 356W and/or length 356L may be configured to provide space for a plowed material (e.g., a conducting material, such as copper) to seat and/or to allow terminal 310 to be flush to a circuit board (e.g., outer walls 352C, 354C may be in direct contact with circuit board 100 and/or substrate 102).

Second middle section 360 may include first side wall 366, second side wall 368, and/or middle wall 370. First side wall 366 and middle side wall 370 may be generally disposed on opposite sides of aperture 380 and/or second side wall 368 and middle side wall 370 may be generally disposed on opposite sides of aperture 382. As generally illustrated in FIG. 6B, if semi-compliant terminal 310 is inserted into a circuit board (e.g., circuit board 100) and/or a force is applied to terminal 310, first side wall 366 and/or second side wall 368 may be configured to flex and/or deflect. Deflection and/or flexing may include portions of a side wall (e.g., side wall 366 and/or 368) moving toward and/or away from axis 312. As generally illustrated in FIG. 6B, deflection may include curving and/or angling of one or more portions of a side wall. Deflection may occur in substantially one plane (e.g., thickness 310T may remain the same) or deflection may occur in more than one plane (e.g., thickness 310T may increase). The amount of potential and/or actual deflection, if any, may correspond to the width, length, thickness, and/or material of a side wall. For example, and without limitation, a side wall including increased width, decreased length, increased thickness, and/or less compliant materials may correspond to relatively less potential and/or actual deflection. A side wall including decreased width, increased length, decreased thickness, and/or more compliant materials may correspond to greater potential and/or actual deflection.

In embodiments, deflection of side wall 366 and/or side wall 368 may be configured to compensate for manufacturing inconsistencies and/or may permit the terminal 310 to be semi-compliant. If semi-compliant terminal 310 is removed from a circuit board (e.g., circuit board 100), side walls 366, 368 may remain in a deflected state (e.g., as generally illustrated in FIG. 6B) and may not return to their original orientation (e.g., deflection may be permanent). Deflection without returning to an original orientation may correspond to the terminal being semi-compliant.

In embodiments, middle wall 370 may include at least some resiliency, which may include being configured to resist flexing and/or deflection and/or may include being configured to not significantly flex or deflect if terminal 310 is inserted into a circuit board (e.g., circuit board 100) and/or if a force is applied to terminal 310. Middle wall 370 may include a length 370L, which may correspond to one or more of the lengths 380L, 382L of apertures 380, 382.

In embodiments, deflection of side wall 366 and/or side wall 368 may comprise and/or correspond to a temporary holding feature, which may be configured to temporarily hold semi-compliant terminal 310 in place with respect to a circuit board (e.g., circuit board 100), which may allow for semi-compliant terminal 310 to be soldered and/or attached to the circuit board. The temporary holding feature may help maintain semi-compliant terminal 310 in a desired orientation relative to a circuit board (e.g., circuit board 100), such as, for example, in a perpendicular orientation. A perpendicular orientation may include a semi-compliant terminal 310 being perpendicular to a circuit board 100. For example, and without limitation, a plane of semi-compliant terminal 310 (e.g., the plane extending in the direction of width 320W) may be substantially parallel with the X-Z plane and the plane 100P of a circuit board 100 may be substantially parallel to the X-Y plane.

In embodiments, first side wall 366 may include a length 366L and second side wall 368 may include a length 368L, which may be substantially the same as or may be different from length 366L of first side wall 366. In embodiments, first side wall 366 and/or second side wall 368 may be configured to maintain or help maintain semi-compliant terminal 310 in a particular orientation relative to a circuit board (e.g., circuit board 100). For example, and without limitation, first side wall 366 and/or second side wall 368, in a non-deflected state, may be substantially parallel to longitudinal axis 312. Additionally, or alternatively, lengths 366L, 368L may correspond to thickness 100T of a circuit board 100 and/or thickness 102T of a substrate 102. In embodiments, first side wall 366 may include an outer wall 366A and/or second side wall 368 may include an outer wall 368A.

Width 366W of first side wall 366, width 368W of second side wall 368, and/or width 370W middle wall 370 may generally correspond to width 380W of aperture 380, width 382W of aperture 382, and/or to a desired amount of deflection. For example, and without limitation, as the widths 380W, 382W of apertures 380, 382 increase, one or more widths 366W, 368W, 370W of the walls 366, 368, 370 may decrease, which may correspond to greater deflection. Additionally or alternatively, as widths 380W, 382W of apertures 380, 382 decrease, one or more of widths 366W, 368W, 370W of the walls 366, 368, 370 may increase, which may correspond to decreased deflection. In embodiments, width 370W of middle wall 370 may remain constant regardless of widths 380W, 382W of the apertures 380, 382 and/or regardless of the widths 366W, 368W of the first side wall 366 and second side wall 368.

In embodiments, it may be desirable for middle portion 340 to include two or more apertures (e.g., apertures 380, 382) for embodiments in which width 320W may be relatively wide and/or in which width 330W may be relatively wide. Embodiments with two or more apertures 380, 382, may provide for greater potential deflection compared to embodiments with a single aperture (e.g., terminals 10, 210) and may also provide greater structural integrity and/or resiliency, such as, without limitation, greater strength in the direction of longitudinal axis 312. In embodiments, greater structural integrity may help prevent first side wall 366 and/or second side wall 368 from completely collapsing during insertion and/or help prevent length 340L of middle portion 340 from substantially decreasing during insertion. In embodiments, middle wall 370 may be resilient configured to provide greater structural integrity.

Additionally or alternatively, in embodiments, tab 352 may include outer walls 352A,B,C, and/or tab 354 may include outer walls 354A,B,C. Outer walls 352A,B,C and/or 354A,B,C may be substantially parallel to and/or substantially perpendicular to longitudinal axis 312.

In embodiments, middle portion 340 may include one or more apertures (e.g., apertures 380, 382). Apertures 380, 382 may extend in recessed portion 356 and/or second middle section 360. Apertures 380, 382 may include one or more of a variety of shapes and/or configurations, and may include, such as, for example, a generally rectangular and/or elongated oval shape. Aperture 380 may include a length 380L and/or a width 380W. Aperture 382 may include a length 382L and/or a width 382W. The widths 380W, 382W of apertures 380, 382 may be substantially constant along their respective lengths 380L, 382L, or width 380W of aperture 380 and/or width 382W of aperture 382 may vary along their respective lengths 380L, 382L. Lengths 380L, 382L of apertures 380, 382 may be substantially equal or unequal.

In embodiments, lengths 380L, 382L may be relatively short (e.g., relative to length 80L of terminal 10), and/or may correspond to thickness 100T of a circuit board 100 and/or thickness 102T of a substrate 102. In embodiments, lengths 380L, 382L may be configured to be smaller than thickness 100T of a circuit board 100 and/or thickness 102T of a substrate 102, which may reduce and/or prevent a solder mask from passing through aperture 380 and/or aperture 382. For example, and without limitation, apertures 380, 382 may be disposed such that their entire lengths 380L, 382L are covered by thickness 100T and/or thickness 102T of a substrate 102 (e.g., between surfaces 104A and 104B) if terminal 310 is inserted into a circuit board (e.g., circuit board 100). In embodiments, as generally illustrated in FIG. 6D, apertures 380, 382 may extend in second middle section 360 and/or recessed portion 356, and/or may not extend in first middle section 350 and/or transition portion 390.

In embodiments, longitudinal axis 380A of aperture 380 and/or longitudinal axis 382A of aperture 382 may be generally parallel to longitudinal axis 312 of semi-compliant terminal 310. Apertures 380, 382 may be disposed at substantially equal distances from longitudinal axis 312 or apertures 380, 382 may be disposed at different distances from longitudinal axis 312. The distance 380D that aperture 380 may be disposed away from longitudinal axis 312 and/or the distance 382D that aperture 382 may be disposed away from longitudinal axis 312 (e.g., the distance from the longitudinal axis 380A, 382A of the aperture to longitudinal axis 312) may correspond to a desired amount of deflection. For example, and without limitation, embodiments in which apertures 380, 382 may be disposed closer to longitudinal axis 312 (e.g., distances 380D, 382D may be smaller) may correspond to less deflection and/or embodiments in which apertures 380, 382 may be disposed farther from longitudinal axis 312 (e.g., distances 380D, 382D may be larger) may correspond to greater deflection.

In embodiments, semi-compliant terminal 310 may include one or more transition portions 390. Transition portion 390 may be configured for a transition between second middle section 360 and second portion 330. For example, and without limitation, second middle section width 360W may be wider than second portion width 330W and/or transition portion 390 may include an outer wall 392, which may be angled to transition between two different widths. Transition portion 390 may include curvature and/or rounding, which may be at or near its intersection with second middle section 360 and/or its intersection with second portion 330.

In embodiments, transition portion 390 may be disposed such that if semi-compliant terminal 310 is inserted into a circuit board (e.g., circuit board 100), transition portion 390 may be generally covered by the thickness 100T of a circuit board 100 and/or thickness 102T of a substrate 102. For example, and without limitation, thickness 100T of a circuit board 100 and/or thickness 102T of a substrate 102 may be at least as thick as the combined length of transition portion length 390L, second middle section length 360L, and recessed portion length 356L. In embodiments, at least some of transition portion 390 may not be covered by thickness 100T of a circuit board 100 and/or thickness 102T of a substrate 102. For example, and without limitation, thickness 100T of a circuit board 100 and/or thickness 102T of a substrate 102 may be thinner than the combined length of transition portion length 390L, second middle section length 360L, and recessed portion length 356L.

As generally illustrated in FIG. 6E, in embodiments, semi-compliant terminal 310 may include a shape that is substantially constant across its thickness 310T. Thickness 310T may be thinner, substantially equal to, or thicker than a width of a widest portion of terminal 310, which may be at first middle section (e.g., width 350W). For example, and without limitation, a thickness 310T may be two or more times smaller than width 350W (e.g., terminal 310 may be at least two times wider than it is thick).

In embodiments, an overall shape of semi-compliant terminals (e.g., terminals 10, 110, 210, 310) may vary in one or more areas. For example, and without limitation, the shape of semi-compliant terminal may be substantially constant across its thickness, except in end portions 322, 332. In embodiments, semi-compliant terminal 310 may be vertically symmetric relative to longitudinal axis 312.

As generally illustrated in FIGS. 8A-8D, in embodiments, semi-compliant terminals (e.g., terminals 10, 110, 210, 310) may be manufactured in rows and/or may initially be connected to each other via tab portions (e.g., tab portions 52, 54, 152, 154, 252, 254, 352, and/or 354). Additionally or alternatively, semi-compliant terminals may be configured to be wrapped around and/or dispensed from a spool.

In embodiments, widths 20W, 120W, 220W, 320W of first portions 20, 120, 220, 320 and/or widths 30W, 130W, 230W, 330W of second portions 30, 130, 230, 330 may correspond to a desired electrical current capacity of a semi-compliant terminal 10, 110. In embodiments, a wider portion may correspond to a greater electrical current capacity. For example, and without limitation, first portion width 20W and/or second portion width 30W may be about 1.5 mm and include a current capacity of about 15 amps, and/or first portion width 120W and/or second portion width 130W may be about 2.8 mm and may include a current capacity of about 23 amps.

The foregoing descriptions of specific embodiments of the present invention have been presented for purposes of illustration and description. They are not intended to be exhaustive or to limit the invention to the precise forms disclosed, and various modifications and variations are possible in light of the above teaching. It should be understood that references to a single element are also intended to include embodiments that may include more than one of that element or zero of that element. It should also be understood that any example provided is not intended to be exhaustive or limit the invention. The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the claims and their equivalents.

What is claimed is:

1. An electrical terminal, comprising:
   a first portion;
   a second portion;
   a middle portion disposed between the first and second portions, the middle portion comprising,
      a first middle section;
      a second middle section;
      a recessed portion disposed between the first middle section and the second middle section; and
      an aperture;
   a transition portion disposed between the middle portion and the second portion;
   wherein the middle portion includes first and second semi-compliant side walls and a resilient middle wall, and the resilient middle wall is disposed substantially parallel to the first and second semi-compliant side walls.

2. The electrical terminal of claim 1, wherein the aperture is disposed entirely in the middle portion.

3. The electrical terminal of claim 1, wherein the aperture is disposed entirely in the second middle section and the recessed portion.

4. The electrical terminal of claim 1, wherein the terminal is configured to prevent a solder mask from passing through the aperture.

5. The electrical terminal of claim 1, wherein the first middle section includes a width, the second middle section includes a width, and a width of the recessed portion is less wide than the widths of the first and second middle sections.

6. The electrical terminal of claim 1, wherein a length of the recessed portion is configured to reduce a press length of the electrical terminal.

7. The electrical terminal of claim 1, wherein the second middle section is semi-compliant.

8. The electrical terminal of claim 7, wherein the first and second semi-compliant side walls are configured to deflect inwardly.

9. The electrical terminal of claim 1, wherein the middle portion includes a second aperture.

10. The electrical terminal of claim 9, wherein the resilient middle wall is substantially parallel with the first portion and the second portion.

11. A semi-compliant electrical terminal, comprising:
    a first connector portion;
    a second connector portion;
    a semi-compliant middle portion, the semi-compliant middle portion comprising,
       a first middle section;
       a second middle section including a first side wall, a second side wall, and a middle wall;
       a first aperture; and
       a second aperture;
    wherein the first side wall and the second side wall are configured to deflect, and the middle wall is disposed between the first aperture and the second aperture; and
    wherein the semi-compliant terminal is configured for use with at least about 23 amps.

12. The semi-compliant electrical terminal of claim 11, wherein outer walls of the semi-compliant middle portion are configured to rub against a plated elongated hole of a circuit board without contacting a substrate of the circuit board.

13. The semi-compliant electrical terminal of claim 11, wherein the middle wall is disposed substantially parallel to the first and second semi-compliant side walls.

14. The semi-compliant electrical terminal of claim 11, wherein the middle wall is configured to resist deflection.

15. The semi-compliant electrical terminal of claim 14, wherein a width of the second middle section is substantially constant and the width of the second middle section is less wide than the width of the first middle section.

16. The semi-compliant electrical terminal of claim 11, comprising a recessed portion between the first middle section and the second middle section.

17. The semi-compliant electrical terminal of claim 16, wherein a length of the recessed portion corresponds to a reduced press length.

18. The semi-compliant electrical terminal of claim 17, wherein a width of the recessed portion is less wide than a width of the first middle section and less wide than a width of the second middle section.

19. A circuit board, comprising:
    a substrate including metal plating; and
    first and second semi-compliant terminals, the first and second semi-compliant terminals comprising:
    a first portion,
    a second portion, and
    a semi-compliant middle portion, the semi-compliant middle portion comprising,
       a first tabbed portion,
       a second tabbed portion including a first side wall and a second side wall, and
       an aperture;
    wherein the first side wall and the second side wall of the first and second semi-compliant terminals are configured to deflect; the second semi-compliant terminal includes a second aperture and a resilient middle wall disposed between the two apertures; and widths of the first and second portions of the second semi-compliant terminal are wider than widths of the first and second portions of the first semi-compliant terminal.

20. The circuit board of claim 19, wherein the resilient middle wall is disposed substantially parallel to the first and second semi-compliant side walls of the second semi-compliant terminal.

* * * * *